US009577148B2

(12) United States Patent
Sugiyama et al.

(10) Patent No.: US 9,577,148 B2
(45) Date of Patent: Feb. 21, 2017

(54) LIGHT EMITTING DIODE ELEMENT AND METHOD OF MANUFACTURING THE SAME

(71) Applicant: THE UNIVERSITY OF TOKYO, Tokyo (JP)

(72) Inventors: Masakazu Sugiyama, Tokyo (JP); Manish Mathew, Tokyo (JP); Yoshiaki Nakano, Tokyo (JP); Hassanet Sodabanlu, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 14/889,927

(22) PCT Filed: Feb. 5, 2014

(86) PCT No.: PCT/JP2014/052670
§ 371 (c)(1),
(2) Date: Nov. 9, 2015

(87) PCT Pub. No.: WO2014/181558
PCT Pub. Date: Nov. 13, 2014

(65) Prior Publication Data
US 2016/0118539 A1    Apr. 28, 2016

(30) Foreign Application Priority Data
May 9, 2013    (JP) .................................. 2013-99378

(51) Int. Cl.
*H01L 33/24*    (2010.01)
*H01L 33/06*    (2010.01)
(Continued)

(52) U.S. Cl.
CPC ........... *H01L 33/24* (2013.01); *H01L 21/0242* (2013.01); *H01L 21/0254* (2013.01);
(Continued)

(58) Field of Classification Search
None
See application file for complete search history.

(56) References Cited

U.S. PATENT DOCUMENTS

| 2001/0035531 A1 | 11/2001 | Kano et al. |
| 2011/0006283 A1 | 1/2011 | Kim |
| 2015/0221728 A1* | 8/2015 | Hikosaka ............ H01L 21/0254 257/76 |

FOREIGN PATENT DOCUMENTS

| JP | 2001-274096 A | 10/2001 |
| JP | 2004-200431 A | 7/2004 |

(Continued)

OTHER PUBLICATIONS

Machine Translation of JP 2008091962A Dated Apr. 2008.*
(Continued)

*Primary Examiner* — Joseph Schoenholtz
(74) *Attorney, Agent, or Firm* — Oliff PLC

(57) ABSTRACT

An n-type GaN layer made of n-type gallium nitride (GaN) is formed on a sapphire substrate. A plurality of island-phased layered structures are formed in random sizes between the n-type GaN layer and a p-type GaN layer that is made of p-type GaN. Each of the layered structures is configured by stacking multiple AlN layers made of aluminum nitride (AlN) and multiple InGaN layers made of indium gallium nitride (InGaN) on an AlN base layer. The respective layered structures emit lights of different wavelengths. This accordingly allows for emission of light in a wider wavelength range.

12 Claims, 21 Drawing Sheets

(51) Int. Cl.
*H01L 33/00* (2010.01)
*H01L 33/08* (2010.01)
*H01L 21/02* (2006.01)
*H01L 33/12* (2010.01)
*H01L 33/32* (2010.01)
*H01L 27/15* (2006.01)
*H01L 33/22* (2010.01)

(52) U.S. Cl.
CPC .... *H01L 21/0262* (2013.01); *H01L 21/02458* (2013.01); *H01L 21/02507* (2013.01); *H01L 27/15* (2013.01); *H01L 33/0075* (2013.01); *H01L 33/06* (2013.01); *H01L 33/08* (2013.01); *H01L 33/12* (2013.01); *H01L 33/32* (2013.01); *H01L 33/22* (2013.01)

(56) References Cited

FOREIGN PATENT DOCUMENTS

| | | | |
|---|---|---|---|
| JP | 2005-079583 | A | 3/2005 |
| JP | 2008-091962 | A | 4/2008 |
| JP | 2008091962 | A * | 4/2008 |
| JP | 2012-234891 | A | 11/2012 |
| JP | 2013-008803 | A | 1/2013 |

OTHER PUBLICATIONS

Soh et al., "Cool White III-Nitride Light Emitting Diodes Based on Phosphor-Free Indium-Rich InGaN Nanostructures," Applied Physics Letters, 2008, vol. 92, pp. 261909-1 thru 261909-3, Date is Jul. 1, 2008.

Apr. 15, 2014 International Search Report issued in International Patent Application No. PCT/JP2014/052670, date is Apr. 15, 2014.

* cited by examiner

| Layer | Partial pressures TMG (hPa) | Partial pressures TMA (hPa) | Partial pressures TEG (hPa) | Partial pressures TMI (hPa) | Partial pressures Cp2Mg (hPa) | Partial pressures NH3 (hPa) | Partial pressures SiH4 (hPa) |
|---|---|---|---|---|---|---|---|
| GaN nucleation layer | 2.65E-02 | 0.00E+00 | 0.00E+00 | 0.00E+00 | 0.00E+00 | 8.11E+01 | 0.00E+00 |
| GaN non-doped layer | 9.99E-02 | 0.00E+00 | 0.00E+00 | 0.00E+00 | 0.00E+00 | 4.07E+01 | 0.00E+00 |
| n-type GaN layer | 8.66E-02 | 0.00E+00 | 0.00E+00 | 0.00E+00 | 0.00E+00 | 3.53E+01 | 2.29E-05 |
| Low-doped n-type GaN layer | 9.84E-02 | 0.00E+00 | 0.00E+00 | 0.00E+00 | 0.00E+00 | 1.54E+01 | 2.61E-05 |
| AlN layer | 0.00E+00 | 6.13E-03 | 0.00E+00 | 0.00E+00 | 0.00E+00 | 6.65E+01 | 0.00E+00 |
| InGaN layer | 0.00E+00 | 0.00E+00 | 1.01E-02 | 1.58E-02 | 0.00E+00 | 6.25E+01 | 0.00E+00 |
| p-type GaN layer | 2.13E-02 | 0.00E+00 | 0.00E+00 | 0.00E+00 | 6.18E-04 | 4.35E+01 | 0.00E+00 |

FIG. 7

| Layer | Partial pressures TMG (hPa) | Partial pressures TMA (hPa) | Partial pressures TEG (hPa) | Partial pressures TMI (hPa) | Partial pressures Cp2Mg (hPa) | Partial pressures NH₃ (hPa) | Partial pressures SiH₄ (hPa) |
|---|---|---|---|---|---|---|---|
| GaN strain relaxation layer | 0.00E+00 | 0.00E+00 | 6.45E-03 | 0.00E+00 | 0.00E+00 | 6.65E+01 | 0.00E+00 |

FIG. 12

| Layer | Partial pressures TMG (hPa) | Partial pressures TMA (hPa) | Partial pressures TEG (hPa) | Partial pressures TMI (hPa) | Partial pressures Cp2Mg (hPa) | Partial pressures NH3 (hPa) | Partial pressures SiH4 (hPa) |
|---|---|---|---|---|---|---|---|
| GaN nucleation layer | 2.65E-02 | 0.00E+00 | 0.00E+00 | 0.00E+00 | 0.00E+00 | 8.11E+01 | 0.00E+00 |
| GaN non-doped layer | 9.99E-02 | 0.00E+00 | 0.00E+00 | 0.00E+00 | 0.00E+00 | 4.07E+01 | 0.00E+00 |
| n-type GaN layer | 8.66E-02 | 0.00E+00 | 0.80E+00 | 0.00E+00 | 0.00E+00 | 3.53E+01 | 2.29E-05 |
| Low-doped n-type GaN layer | 9.84E-02 | 0.00E+00 | 0.00E+00 | 0.00E+00 | 0.00E+00 | 1.54E+01 | 2.61E-05 |
| GaN strain relaxation layer | 0.00E+00 | 0.00E+00 | 1.94E-02 | 0.00E+00 | 0.00E+00 | 1.20E+02 | 1.19E-05 |
| AlN layer | 0.00E+00 | 1.11E-02 | 0.00E+00 | 0.00E+00 | 0.00E+00 | 1.20E+02 | 1.19E-05 |
| InGaN layer | 0.00E+00 | 0.00E+00 | 1.84E-02 | 1.14E-02 | 0.00E+00 | 1.13E+02 | 0.00E+00 |
| AlGaN layer | 7.88E-03 | 6.67E-04 | 0.00E+00 | 0.00E+00 | 4.78E-04 | 5.74E+00 | 0.00E+00 |
| p-type GaN layer | 2.11E-02 | 0.00E+00 | 0.00E+00 | 0.00E+00 | 1.36E-03 | 4.30E+01 | 0.00E+00 |

FIG. 19

| Layer | Partial pressures TMG (hPa) | Partial pressures TMA (hPa) | Partial pressures TEG (hPa) | Partial pressures TMI (hPa) | Partial pressures Cp2Mg (hPa) | Partial pressures NH3 (hPa) | Partial pressures SiH4 (hPa) |
|---|---|---|---|---|---|---|---|
| GaN nucleation layer | 2.65E-02 | 0.00E+00 | 0.00E+00 | 0.00E+00 | 0.00E+00 | 8.11E+01 | 0.00E+00 |
| GaN non-doped layer | 9.99E-02 | 0.00E+00 | 0.00E+00 | 0.00E+00 | 0.00E+00 | 4.07E+01 | 0.00E+00 |
| n-type GaN layer | 1.07E-01 | 0.00E+00 | 0.00E+00 | 0.00E+00 | 0.00E+00 | 4.35E+01 | 2.82E-05 |
| Low-doped n-type GaN layer | 9.84E-02 | 0.00E+00 | 0.00E+00 | 0.00E+00 | 0.00E+00 | 1.54E+01 | 2.61E-05 |
| GaN barrier layer | 0.00E+00 | 0.00E+00 | 1.94E-02 | 0.00E+00 | 0.00E+00 | 1.20E+02 | 1.19E-05 |
| InGaN well layer | 0.00E+00 | 0.00E+00 | 1.84E-02 | 1.14E-02 | 0.00E+00 | 1.13E+02 | 0.00E+00 |
| AlN layer | 0.00E+00 | 1.22E-02 | 0.00E+00 | 0.00E+00 | 0.00E+00 | 1.33E+02 | 1.32E-05 |
| InGaN layer | 0.00E+00 | 0.00E+00 | 1.21E-02 | 4.74E-02 | 0.00E+00 | 1.25E+01 | 0.00E+00 |
| AlGaN block layer | 7.88E-03 | 6.67E-04 | 0.00E+00 | 0.00E+00 | 4.78E-04 | 5.74E+01 | 0.00E+00 |
| p-type GaN layer | 2.11E-02 | 0.00E+00 | 0.00E+00 | 0.00E+00 | 1.36E-03 | 4.30E+01 | 0.00E+00 |

FIG. 24

LIGHT EMITTING DIODE ELEMENT AND METHOD OF MANUFACTURING THE SAME

TECHNICAL FIELD

The present invention relates to a light emitting diode element and a method of manufacturing the same and more specifically relates to a light emitting diode element including a first conductive-type semiconductor layer that is made of first conductive-type gallium nitride and a second conductive-type semiconductor layer that is made of second conductive-type gallium nitride different from the first conductive-type gallium nitride, and a method of manufacturing the same.

BACKGROUND ART

A proposed configuration of this type of light emitting diode element includes an InGaN quantum well layer having an InGaN (indium gallium nitride) nanostructure of indium-rich composition on a GaN (gallium nitride) layer (for example, Patent Literature 1). The light emitting diode element of this configuration emits light of cool white color having a relatively sharp peak around 430 nm in an emission spectrum.

CITATION LIST

Non-Patent Literature

[NPL 1] C. E. Soh, W. Liu, J. H. Teng, S. Y. Chow, S. S. Ang et al., "Cool white III-nitride light emitting diodes based on phosphor-free indium-rich InGaN nanostructures", Applied Physics Letters 92, 261909 (2008)

SUMMARY OF INVENTION

The light emitting diode element described above, however, emits only cool white light or more specifically only light of relatively bluish white color. In some applications of the light emitting diode element, there is a need for light of reddish or yellowish white color at the longer wavelength or there is a need to emit light in a wider wavelength range.

With regard to a light emitting diode element and a method of manufacturing the same, an object of the invention is to allow for emission of light in a wider wavelength range.

In order to achieve the above primary object, the light emitting diode element and the method of manufacturing the same of the invention employs the following configuration.

The present invention is directed to a light emitting diode element that includes a first conductive-type semiconductor layer that is made of first conductive-type gallium nitride and a second conductive-type semiconductor layer that is made of second conductive-type gallium nitride different from the first conductive-type gallium nitride. The light emitting diode element further includes a plurality of island-shaped layered structures that are formed in random sizes between the first conductive-type semiconductor layer and the second conductive-type semiconductor layer. The layered structure is configured by stacking a first layer that is made of indium gallium nitride and a second layer that is made of a nitride containing at least one of aluminum, gallium and indium and receiving tensile strain by gallium nitride, on a base layer that is made of a nitride containing at least one of aluminum, gallium and indium and receiving tensile strain by gallium nitride.

In the light emitting diode element according to this aspect, when a voltage is applied between the first conductive-type semiconductor layer and the second conductive-type semiconductor layer, the plurality of island-shaped layered structures in random sizes respectively emit lights. This allows for emission of light in a relatively wide wavelength range. In the layered structure of this aspect, multiple first layer and multiple second layers may be stacked alternately.

In the light emitting diode element according to this aspect, the second layer may be formed thinner than the first layer.

In the light emitting diode element according to this aspect, the light emitting diode element may further includes a strain relaxation layer that is formed from gallium nitride in at least one location out of between the first conductive-type semiconductor layer and the base layer, between the base layer and the first layer, and between the first layer and the second layer. The presence of the strain relaxation layer enables the wavelength of emitted light to be adjusted. In this case, the layered structure may include the strain relaxation layer exposed, and the light emitting diode element may further include a second strain relaxation layer that is formed from aluminum gallium nitride between the layered structures and the second conductive-type semiconductor layer.

In the light emitting diode element of the above aspect that includes the strain relaxation layer, the strain relaxation layer may be formed thinner than the first layer.

Further, in the light emitting diode element according to this aspect, the light emitting diode element may further include a quantum well structure that is formed either between the layered structures and the first conductive-type semiconductor layer or between the layered structures and the second conductive-type semiconductor layer, the quantum well structure being configured to include n barrier layers and (n−1) quantum well layers that are formed from a material having a smaller band gap than that of the barrier layer between respective two barrier layers of the n barrier layers, where n is an integral number of not less than 2. This aspect manufactures a light emitting diode element that emits light of the higher intensity. In this case, the layered structure may be configured by alternately stacking the first layer and the second layer once or twice, and n may be either 2 or 3.

The present invention is also directed to a method of manufacturing a light emitting diode element that comprises a first conductive-type semiconductor layer that is made of first conductive-type gallium nitride and a second conductive-type semiconductor layer that is made of second conductive-type gallium nitride. The method of manufacturing the light emitting diode element includes a base layer forming step that forms a base layer from a nitride that contains at least one of aluminum, gallium and indium and receives tensile strain by gallium nitride, on the first conductive-type semiconductor layer by metal organic vapor phase epitaxy, a layered structure forming step that performs a step of forming a first layer from indium gallium nitride on the formed base layer by metal organic vapor phase epitaxy and a step of forming a second layer from a nitride that contains at least one of aluminum, gallium and indium and receives tensile strain by gallium nitride, by metal organic vapor phase epitaxy, so as to form a layered structure configured by stacking the first layer and the second layer, and a second conductive-type semiconductor layer forming step that forms the second conductive-type semiconductor layer from the second conductive gallium nitride on the formed layered structure by metal organic vapor phase epitaxy.

The method of manufacturing the light emitting diode element according to this aspect forms the base layer from the nitride that contains at least one of aluminum, gallium and indium and receives tensile strain by gallium nitride, by metal organic vapor phase epitaxy. The method subsequently performs the step of forming the first layer from indium gallium nitride on the formed base layer by metal organic vapor phase epitaxy and the step of forming the second layer from the nitride that contains at least one of aluminum, gallium and indium and receives tensile strain by gallium nitride, by metal organic vapor phase epitaxy, so as to form the layered structure configured by stacking the first layer and the second layer. This forms a plurality of island-shaped layered structures of random sizes. Forming the plurality of island-shaped layered structures of random sizes may be attributed to that the base layer receives tensile stress from the first conductive-type semiconductor layer and is thereby divided into small areas of random sizes. Compared with formation by lithography, etching or the like, this method facilitates manufacture of the light emitting diode element including a plurality of island-shaped layered structures formed in random sizes between the first conductive-type semiconductor layer and the second conductive-type semiconductor layer and configured by stacking the first layer that is made of indium gallium nitride and the second layer that is made of the nitride containing at least one of aluminum, gallium and indium and receiving tensile strain by gallium nitride, on the base layer that is made of the nitride containing at least one of aluminum, gallium and indium and receiving tensile strain by gallium nitride, or, in other words, the light emitting diode element that emits light in a relatively wide wavelength range. Here, the layered structure forming step may alternately repeat the step of forming the first layer and the step of forming the second layer multiple number of times, so as to form the layered structure configured by alternately stacking multiple first layers and multiple second layers.

In the method of manufacturing the light emitting diode element according to this aspect, the layered structure forming step may include a step of forming a strain relaxation layer from gallium nitride by metal organic vapor phase epitaxy in at least one location out of between the first conductive-type semiconductor layer and the base layer, between the base layer and the first layer, and between the first layer and the second layer. The presence of the strain relaxation layer is expected to relieve a stress applied to the second layer and adjust the sizes of division of the second layer. This accordingly controls the sizes of the layered structures and thereby adjusts the wavelength of the emitted light. In this case, the layered structure forming step may include a step of forming a second strain relaxation layer from aluminum gallium nitride on the strain relaxation layer by metal organic vapor phase epitaxy, and the second conductive-type semiconductor layer forming step may form the second conductive-type semiconductor layer on the second strain relaxation layer by metal organic vapor phase epitaxy.

Further, in the method of manufacturing the light emitting diode element according to this aspect, the metal organic vapor phase epitaxy in the base layer forming step and in the layered structure forming step may cause crystal growth at temperature between 750° C. and 800° C., inclusive. This aspect manufactures a light emitting diode element of the higher quality.

Furthermore, in the method of manufacturing the light emitting diode element according to this aspect, may further include, before the base layer forming step or after the layered structure forming step, a quantum well structure forming step that forms a quantum well structure configured to include n barrier layers and (n−1) quantum well layers that are formed from a material having a smaller band gap than that of the barrier layer between the barrier layers, where n is an integral number of not less than 2. This aspect manufactures a light emitting diode element that emits light of the higher intensity.

BRIEF DESCRIPTION OF DRAWINGS

FIG. 7 is a table showing an example of partial pressures of reactive gases in a metal organic vapor phase epitaxy employed for formation of respective layers;

FIG. 12 is a table showing an example of partial pressures of TMG, TMA, TEG, TMI, Cp2Mg, $NH_3$ and $SiH_4$ in the MOVPE method employed for formation of GaN strain relaxation layers 136;

Figure 17:
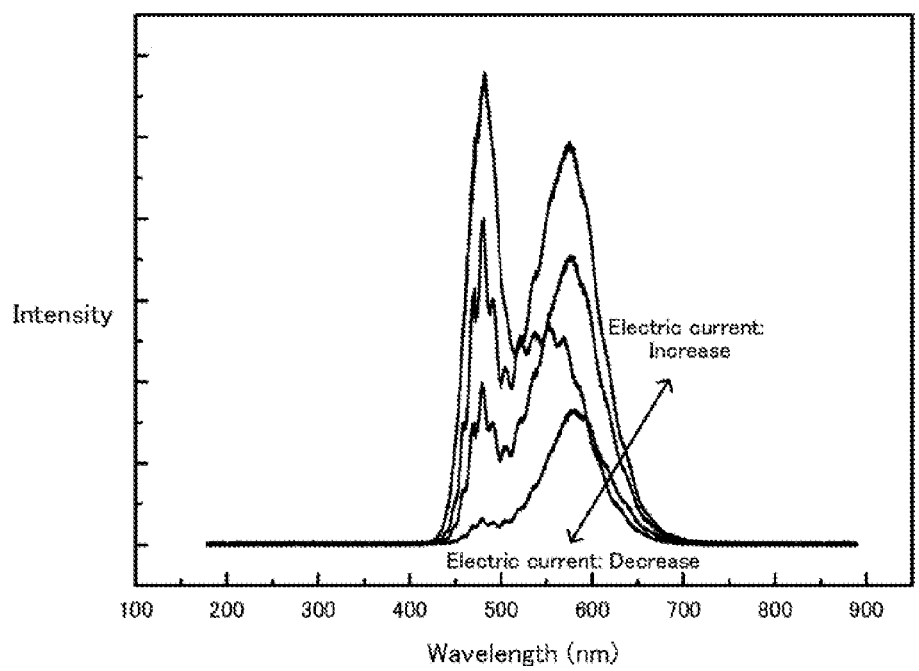
Figure 18:
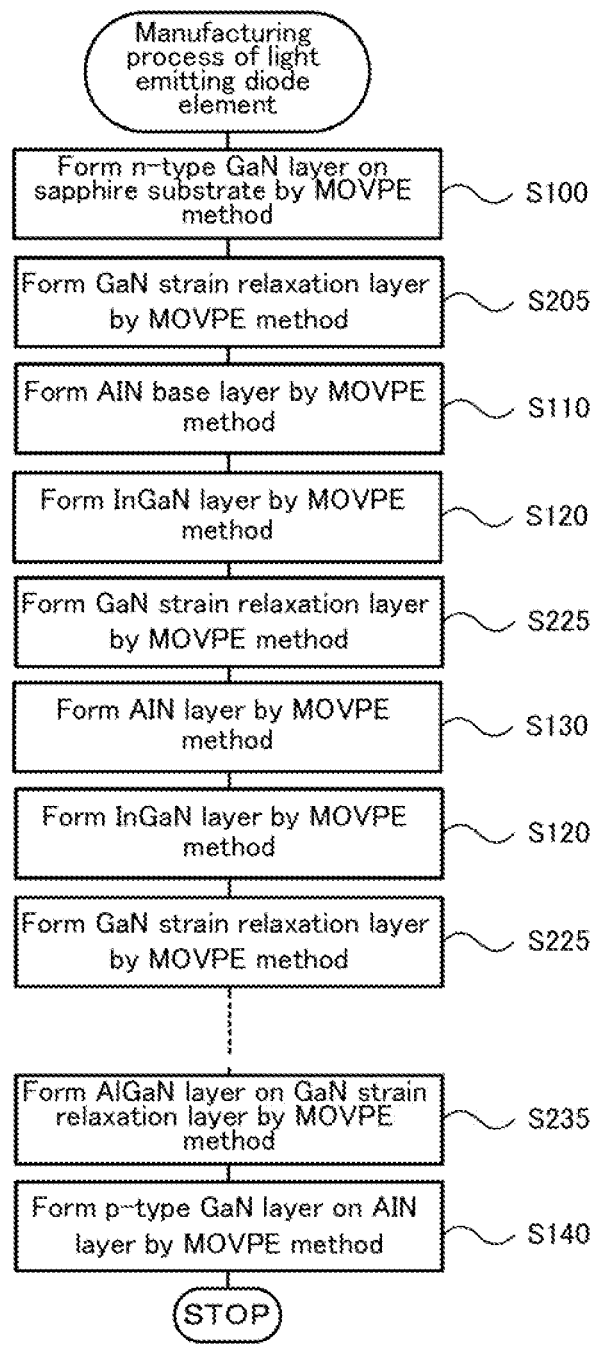
Figure 20:
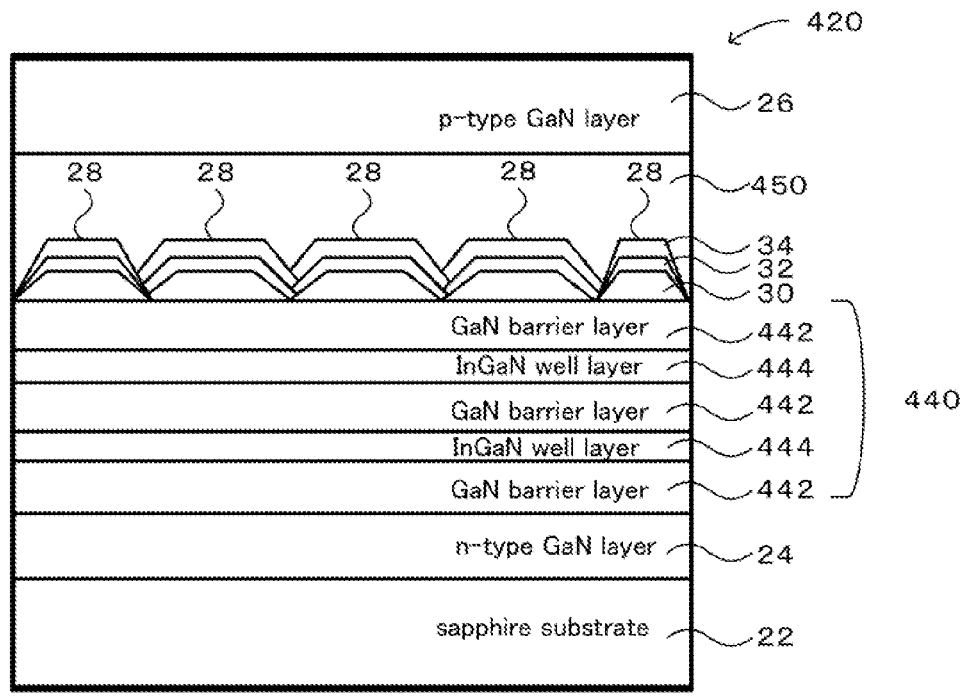
Figure 21:
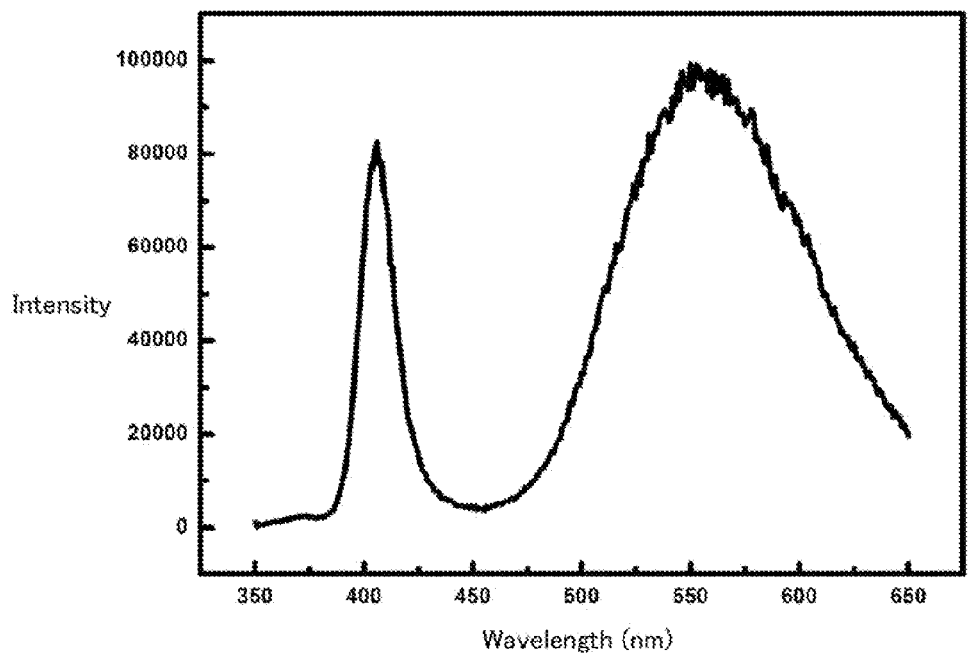
Figure 22:
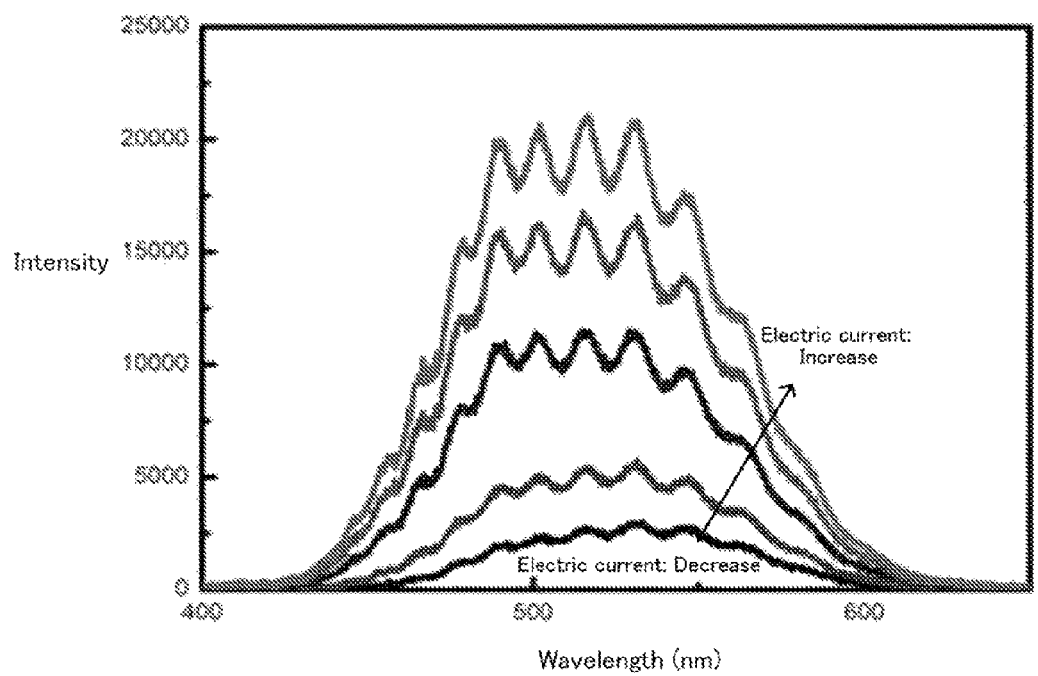
Figure 23:
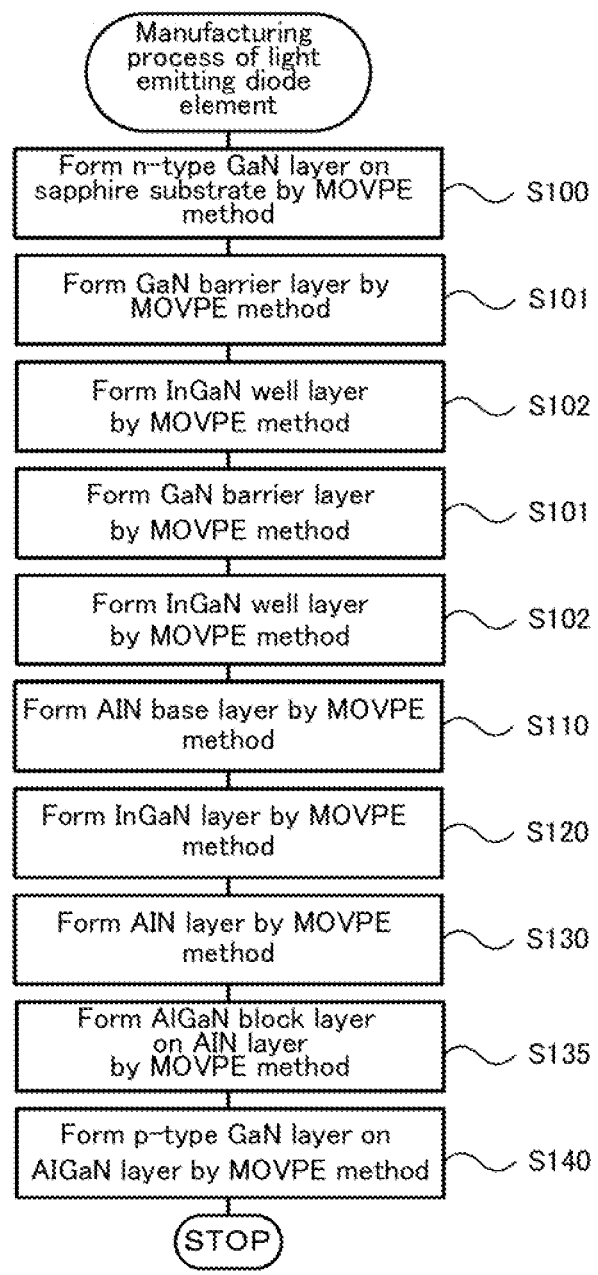
Figure 25:
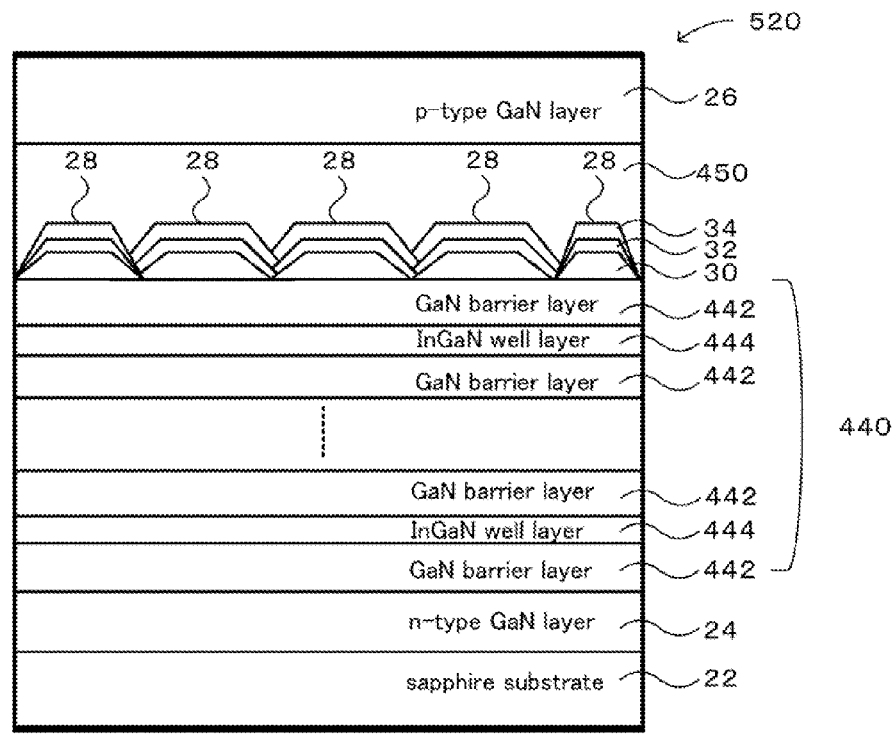
Figure 26:
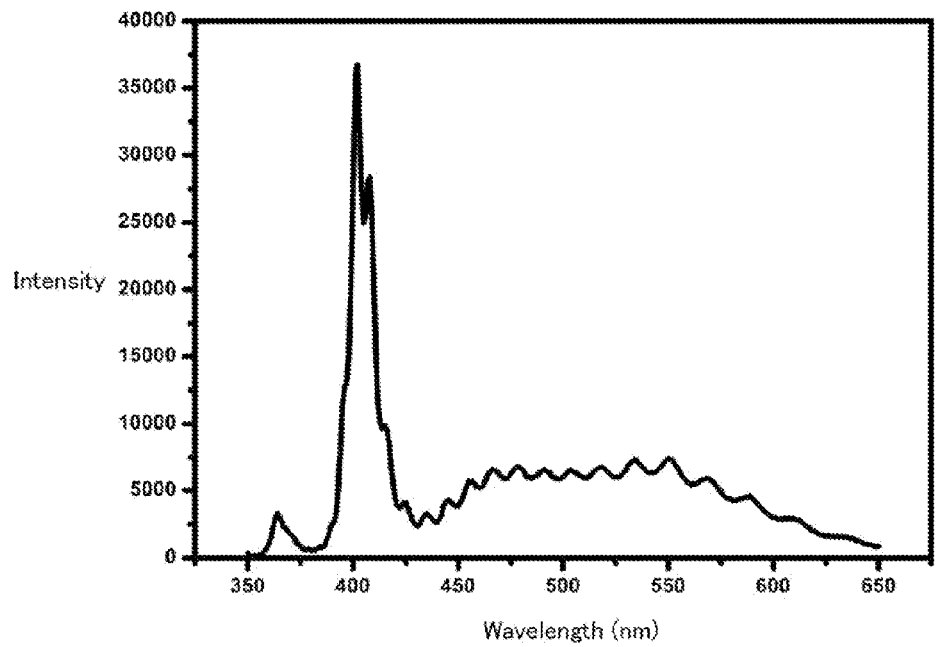
Figure 27:
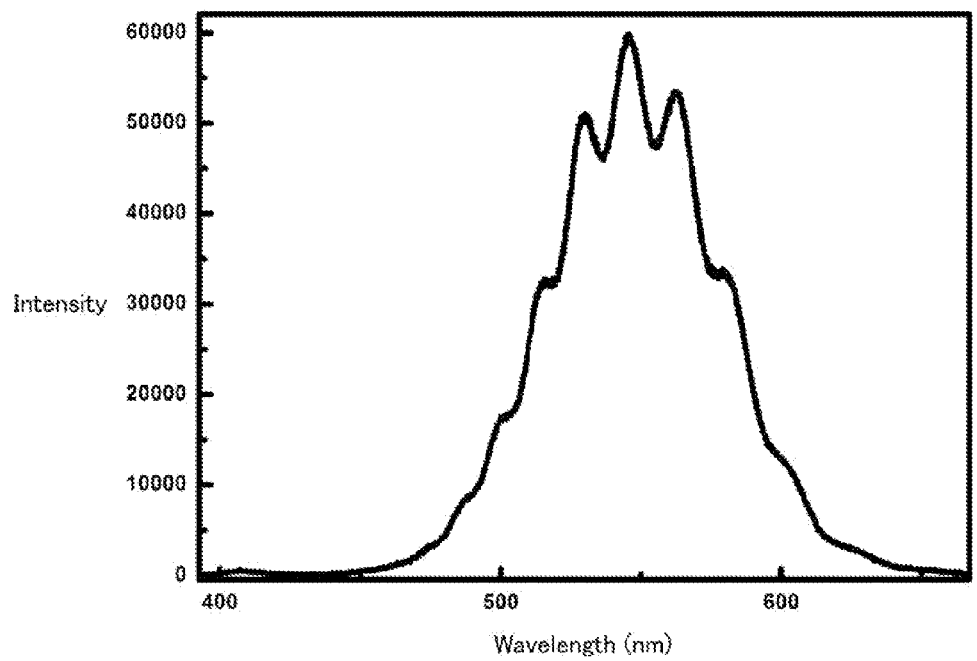
Figure 28:
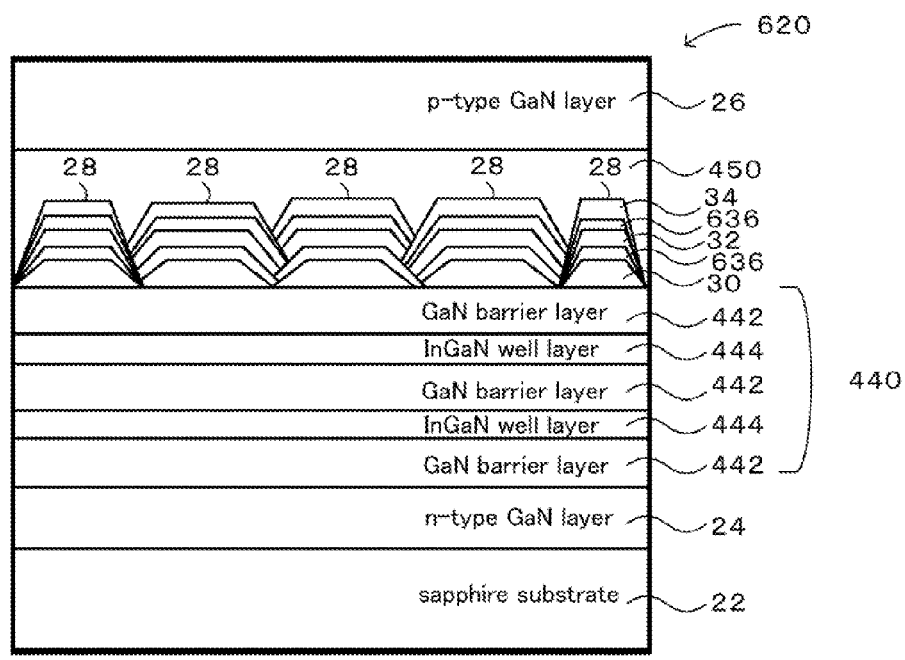
Figure 29:
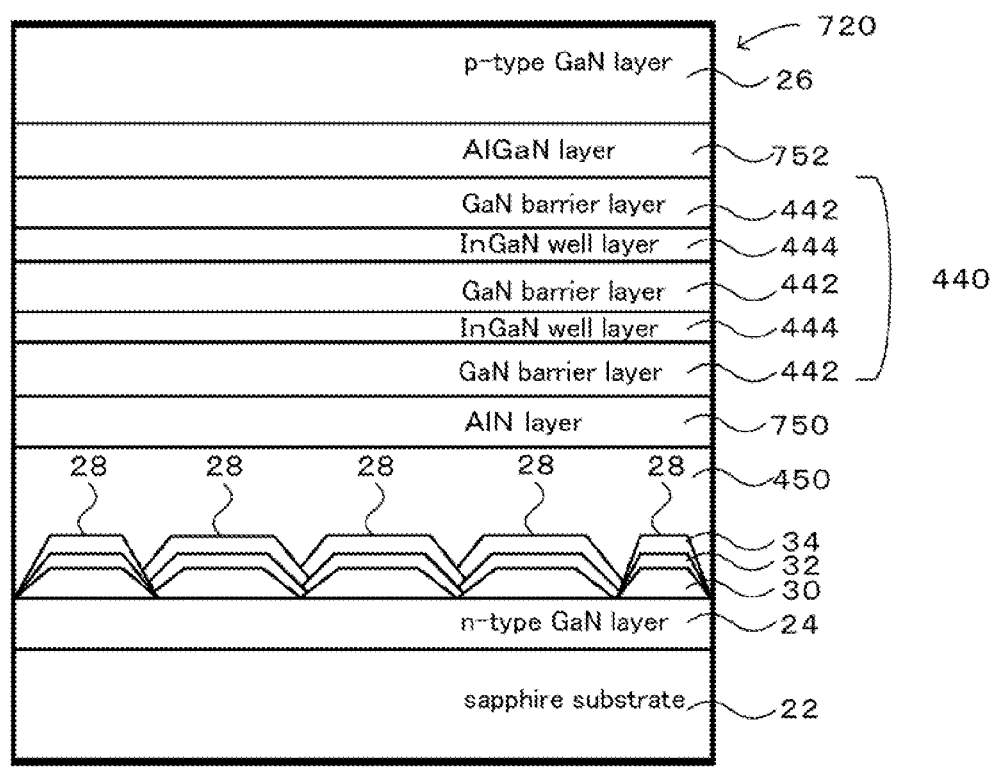

FIG. 17 is a diagram illustrating an example of relationship of intensity of light emitted from the light emitting diode element 220 to wavelength of the light with regard to a variation in electric current flowing between the n-type GaN layer 24 and the p-type GaN layer 26 in the light emitting diode element 220;

FIG. 18 is a flowchart showing an example of manufacturing process of the light emitting diode element 220;

FIG. 19 is a table showing an example of partial pressures of TMG, TMA, TEG, TMI, Cp2Mg, $NH_3$ and $SiH_4$ in the MOVPE method employed for formation of the respective layers of the light emitting diode element 220;

FIG. 20 is a sectional view schematically illustrating the section of a main part of a light emitting diode element 420 according to a fourth embodiment of the invention;

FIG. 21 is a diagram illustrating an example of relationship of intensity of light emitted from the light emitting diode element 420 to wavelength of the light;

FIG. 22 is a diagram illustrating an example of relationship of intensity of light emitted from the light emitting diode element 420 to wavelength of the light with regard to a variation in electric current flowing between the n-type GaN layer 24 and the p-type GaN layer 26;

FIG. 23 is a flowchart showing an example of manufacturing process of the light emitting diode element 420;

FIG. 24 is a table showing an example of partial pressures of TMG, TMA, TEG, TMI, Cp2Mg, $NH_3$ and $SiH_4$ in the MOVPE method employed for formation of the respective layers;

FIG. 25 is a sectional view schematically illustrating the section of a main part of a light emitting diode element 520 according to a modification;

FIG. 26 is a diagram illustrating an example of relationship of intensity of light emitted from the light emitting diode element 520 of the modification to wavelength of the light;

FIG. 27 is a diagram illustrating an example of relationship of intensity of light emitted from the light emitting diode element 520 of the modification to wavelength of the light with regard to electric current flowing between the n-type GaN layer 24 and the p-type GaN layer 26 in the light emitting diode element 520;

FIG. 28 is a sectional view schematically illustrating the section of a main part of a light emitting diode element 620 according to a modification; and FIG. 29 is a sectional view schematically illustrating the section of a main part of a light emitting diode element 720 according to a modification.

DESCRIPTION OF EMBODIMENTS

The following describes some aspects of the invention with reference to embodiments.

Figure 1:
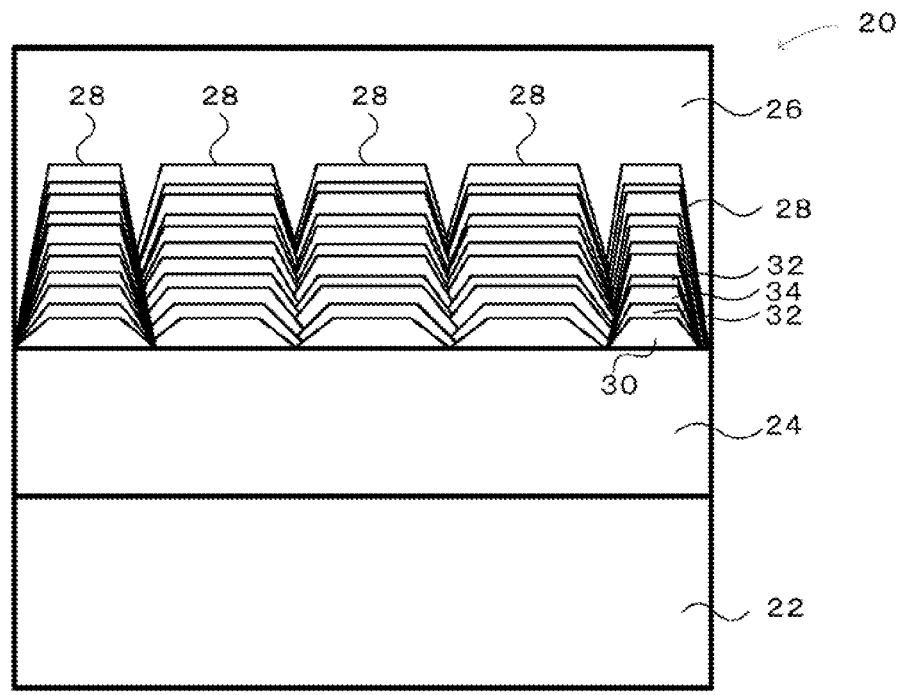
FIG. 1 is a sectional view schematically illustrating the section of a main part of a light emitting diode element 20 according to one embodiment of the invention.
Figure 2:
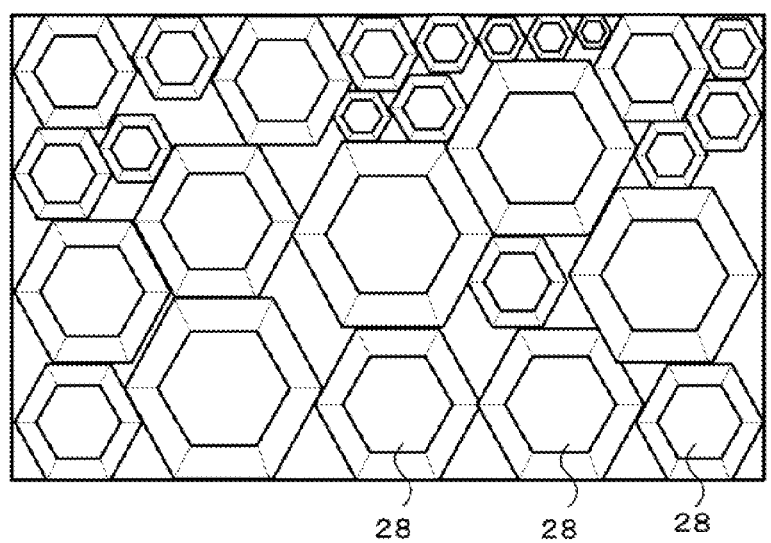
FIG. 2 is a plan view schematically illustrating layered structures 28 of the light emitting diode element 20 placed on an n-type GaN layer.
Figure 3:
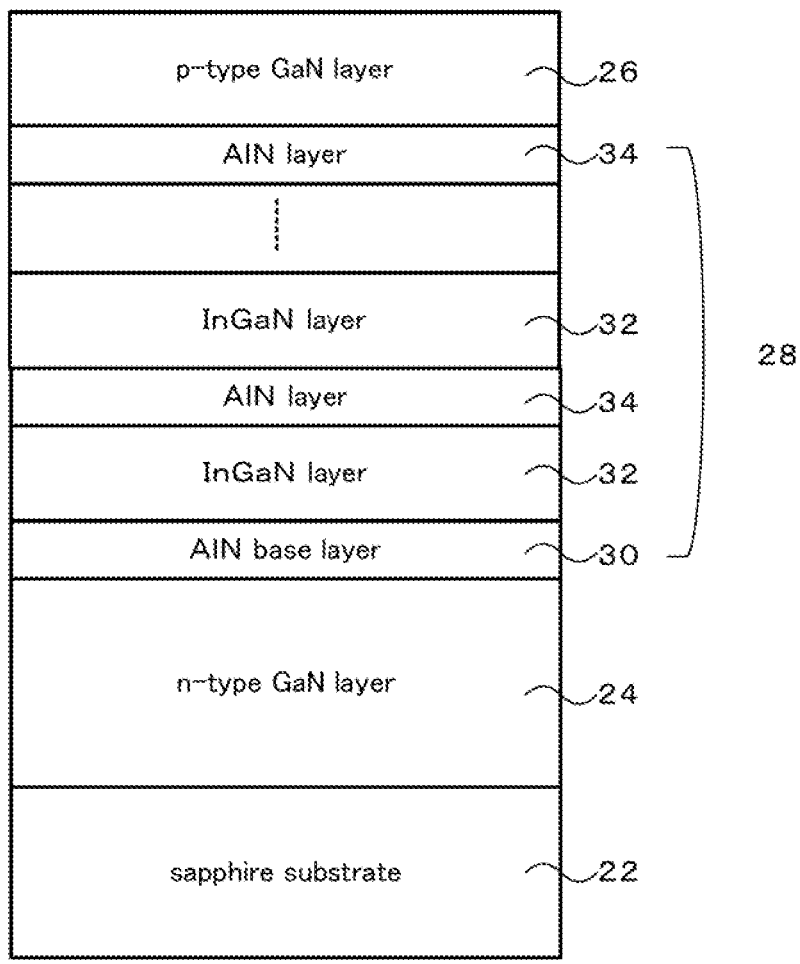
FIG. 3 is a diagram illustrating an example of configuration of the layered structure 28.

FIG. 1 is a sectional view schematically illustrating the section of a main part of a light emitting diode element 20 according to one embodiment of the invention. FIG. 2 is a plan view schematically illustrating layered structures 28 of the light emitting diode element 20 placed on an n-type GaN layer 24. FIG. 3 is a diagram illustrating an example of configuration of the layered structure 28. As illustrated in FIGS. 1 to 3, the light emitting diode element 20 is formed on a sapphire substrate 22 at (0001) plane made of sapphire and includes a nucleation layer (not shown) of 25 nm in thickness formed from gallium nitride (GaN), a GaN non-doped layer (not shown) of 300 nm in thickness formed from GaN without doping any impurity, an n-type GaN layer 24 of about 3.7 μm in thickness formed from n-type GaN, a p-type GaN layer 26 of 130 nm in thickness formed from p-type GaN, and a plurality of island-shaped layered structures 28 of 40 nm in thickness formed in random sizes with sloped side faces between the n-type GaN layer 24 and the p-type GaN layer 26.

Each layered structure 28 is configured such that an InGaN layer 32 made of indium gallium nitride (InGaN) and an AlN layer 34 made of aluminum nitride (AlN) are alternately stacked multiple times on an AlN base layer 30 made of AlN and that the top-most layer is the AlN layer 34. The layered structures 28 are formed in random sizes of less than about 1 μm in the (0001) plane that is the crystal plane of the sapphire substrate 22. The AlN layers 34 on the side faces of the respective layered structures 28 form crystal planes that are different from the (0001) plane.

Figure 4:
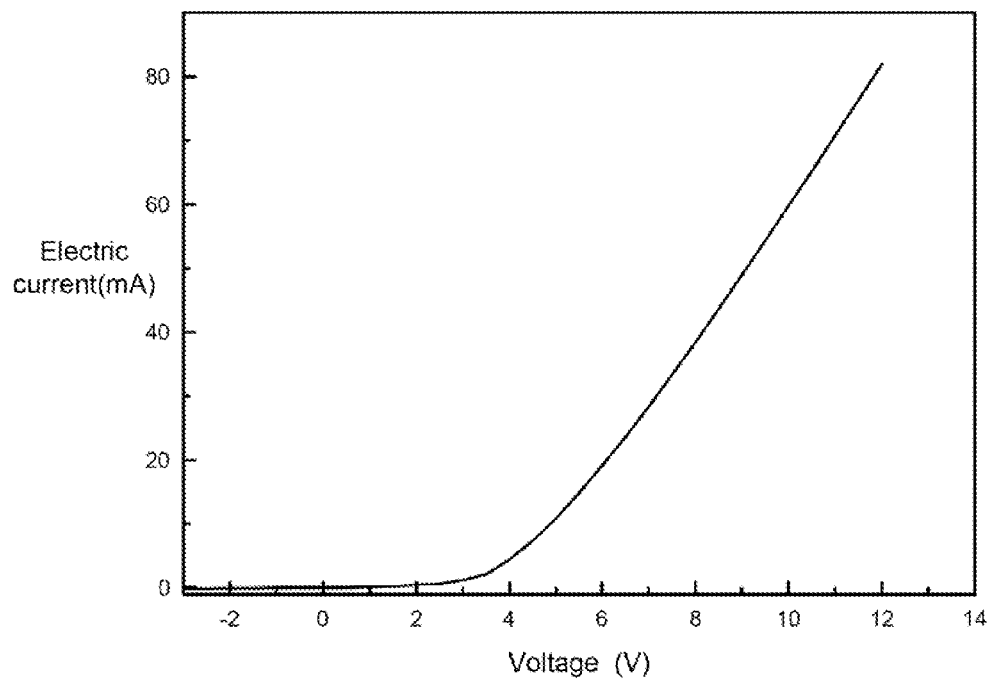
FIG. 4 is a diagram showing an example of relationship of electric current flowing between an n-type GaN layer 24 and a p-type GaN layer 26 to voltage applied between the n-type GaN layer 24 and the p-type GaN layer 26.
Figure 5:
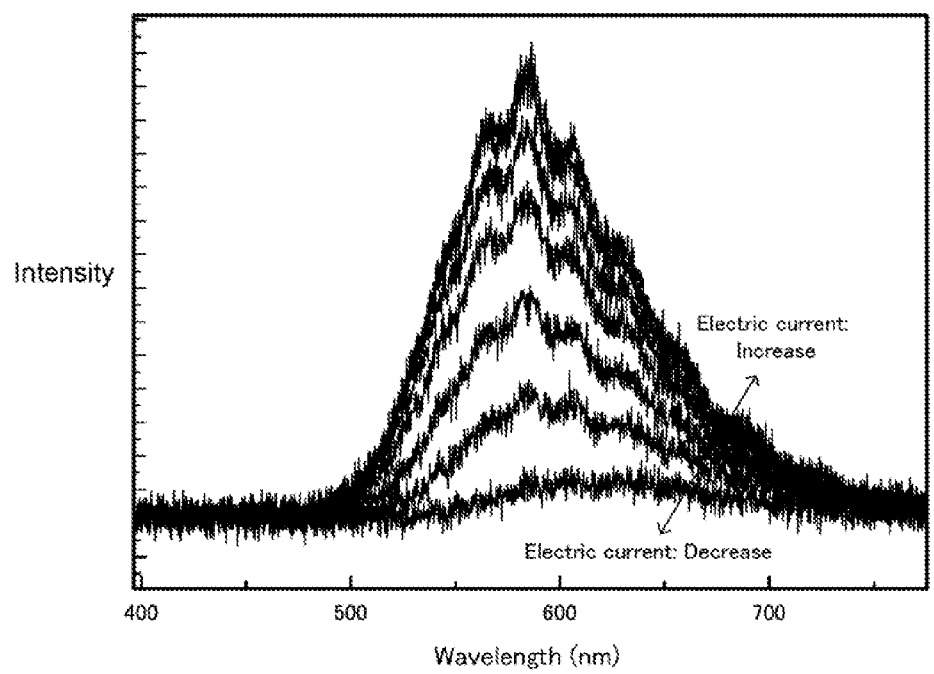
FIG. 5 is a diagram illustrating an example of relationship of intensity of light emitted from the light emitting diode element 20 to wavelength of the light with regard to a variation in electric current flowing between the n-type GaN layer 24 and the p-type GaN layer 26.

The following describes the operations of the light emitting diode element 20 having the above configuration. FIG. 4 is a diagram showing an example of relationship of electric current flowing between the n-type GaN layer 24 and the p-type GaN layer 26 to voltage applied between the n-type GaN layer 24 and the p-type GaN layer 26. As illustrated, the light emitting diode element 20 has the characteristic of diode that causes electric current to abruptly start flowing when the voltage between the n-type GaN layer 24 and the p-type GaN layer 26 becomes equal to or higher than 3.5 V. FIG. 5 is a diagram illustrating an example of relationship of intensity of light emitted from the light emitting diode element 20 to wavelength of the light with regard to a variation in electric current flowing between the n-type GaN layer 24 and the p-type GaN layer 26. As illustrated, the light emitting diode element 20 emits light in a relatively wide wavelength range of about 500 nm to 700 nm or, in other words, emits light of white color as a whole. Increasing the electric current flowing between the n-type GaN layer 24 and the p-type GaN layer 26 increases the intensity of the light and provides a peak at the wavelength of about 570 nm to emit light of yellowish white color. Emitting light of such white color may be attributed to that the plurality of layered structures 28 formed in random sizes have different crystal planes at side faces of the respective layered structures 28 and accordingly emit lights at different wavelengths. This configuration allows for emission of light in a wider wavelength range.

Figure 6:
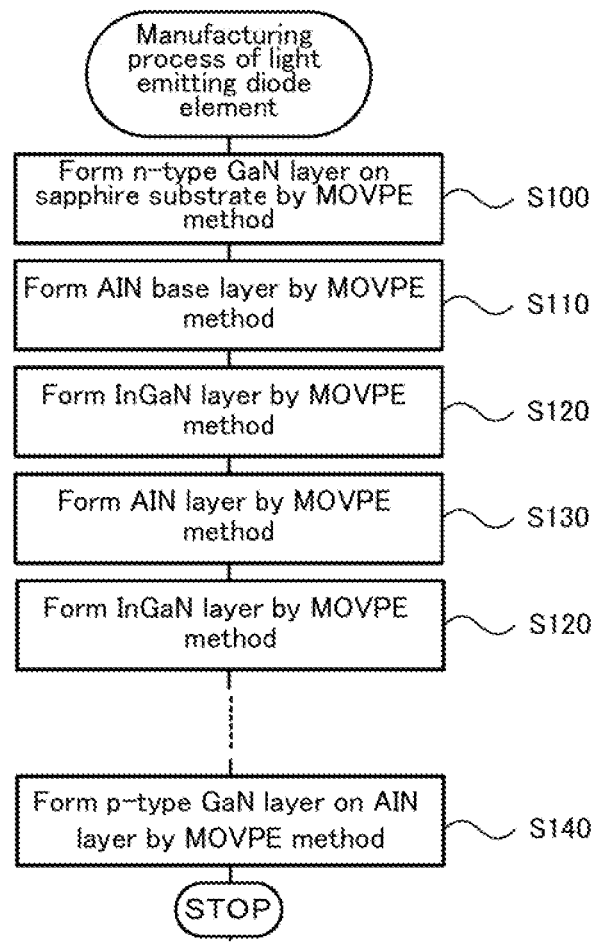
FIG. 6 is a flowchart showing an example of manufacturing process of a light emitting diode element.

The following describes a method of manufacturing the light emitting diode element 20. FIG. 6 is a flowchart showing an example of manufacturing process of a light emitting diode element. FIG. 7 is a table showing an example of partial pressures of trimethyl gallium (TMG), trimethyl aluminum (TMA), triethyl gallium (TEG), triethyl indium (TMI), biscyclopentadiethyl magnesium (Cp2Mg), ammonia ($NH_3$) and monosilane ($SiH_4$) in metal organic vapor phase epitaxy) employed for formation of the respective layers. The respective layers are formed by the MOVPE method, and partial pressures in the respective layers formed by the MOVPE method are shown in this table. The following describes the other manufacturing conditions.

The manufacturing process first forms a nucleation layer 23a of 25 nm in thickness from GaN at 550° C. and subsequently forms a GaN non-doped layer 23b of 300 nm in thickness from GaN without doping any impurity and an n-type GaN layer 24 of 4 μm in thickness from GaN doped with silicon (Si) at the temperature increased to 1130° C. (step S100). The pressure in a reaction vessel is set to 20 hPa during formation of these layers. The upper surface of the n-type GaN layer 24 is formed as a low-doped n-type GaN layer having low impurity concentration.

The manufacturing process subsequently forms an AlN base layer 30 of 4 nm in thickness from AlN on the n-type GaN layer 24 at 780° C. and the pressure of the reaction vessel set to 100 hPa (step S110). GaN and AlN have different crystal sizes, so that a tensile stress is likely to be applied to the formed AlN base layer 30. This is likely to make a plurality of fine grooves (grooves of about several nanometers at most) and divide the AlN base layer 30 into areas in random sizes of about less than 1 µm in the (0001) plane that is the crystal plane of the sapphire substrate 22. Growing AlN at 780° C. suppresses deterioration of the crystal quality.

The manufacturing process then forms an InGaN layer 32 of 4.2 nm in thickness from InGaN on the AlN base layer 30 that is divided into the areas in random sizes, at 780° C. and the pressure of the reaction vessel set to 100 hPa (step S120). Growing InGaN at 780° C. suppresses deterioration of the crystal quality, compared with growing InGaN at about 670° C. to 730° C.

The manufacturing process subsequently forms an AlN layer 34 of 2 nm in thickness from AlN at 780° C. and the pressure of the reaction vessel set to 100 hPa (step S130). In some cases, a stress may be applied to the formed AlN layer 34 to further divide the AlN layer 34 into smaller areas. The processes of steps S120 and S130 are repeated a predetermined number of times (for example, four times) to provide the height of about 40 nm. Repetition of these steps forms the plurality of island-shaped layered structures 28 in random sizes.

After forming the layered structures 28, the manufacturing process forms a p-type GaN layer 26 of 130 nm in thickness from GaN doped with magnesium (Mg) at the temperature increased to 1020° C. and the pressure of the reaction vessel set to 200 hPa (step S140) and is terminated. This method manufactures the light emitting diode element that emits light in a wider wavelength range, while suppressing deterioration of the crystal quality. Employing the MOVPE method to form the respective layers manufactures the light emitting diode element 20 that has the plurality of island-shaped layered structures 28. Compared with a method employing lithography, etching or the like, this enables the light emitting diode element that emits light in a wider wavelength range to be manufactured by the simpler method.

The light emitting diode element 20 of the first embodiment described above has the plurality of island-shaped layered structures 28 formed in random sizes between the n-type GaN layer 24 and the p-type GaN layer 26 and thereby allows for emission of light in a wider wavelength range. In the process of manufacturing this light emitting diode element 20, the AlN base layer 30, the InGaN layers 32 and the AlN layers 34 of the light emitting diode element 20 are formed by the MOVPE method at the temperature of not lower than 780° C. This manufactures the light emitting diode element that emits light in a wider wavelength range, while suppressing deterioration of the crystal quality.

A light emitting diode element 120 of a second embodiment has similar configuration to that of the light emitting diode element 20 of the first embodiment, except that GaN strain relaxation layers 136 are formed between InGaN layers 32 and AlN layers in each layered structure 128. The like elements in the light emitting diode element 120 to those in the light emitting diode element 20 of the first embodiment are expressed by the like numerical symbols and are not specifically described.

Figure 8:
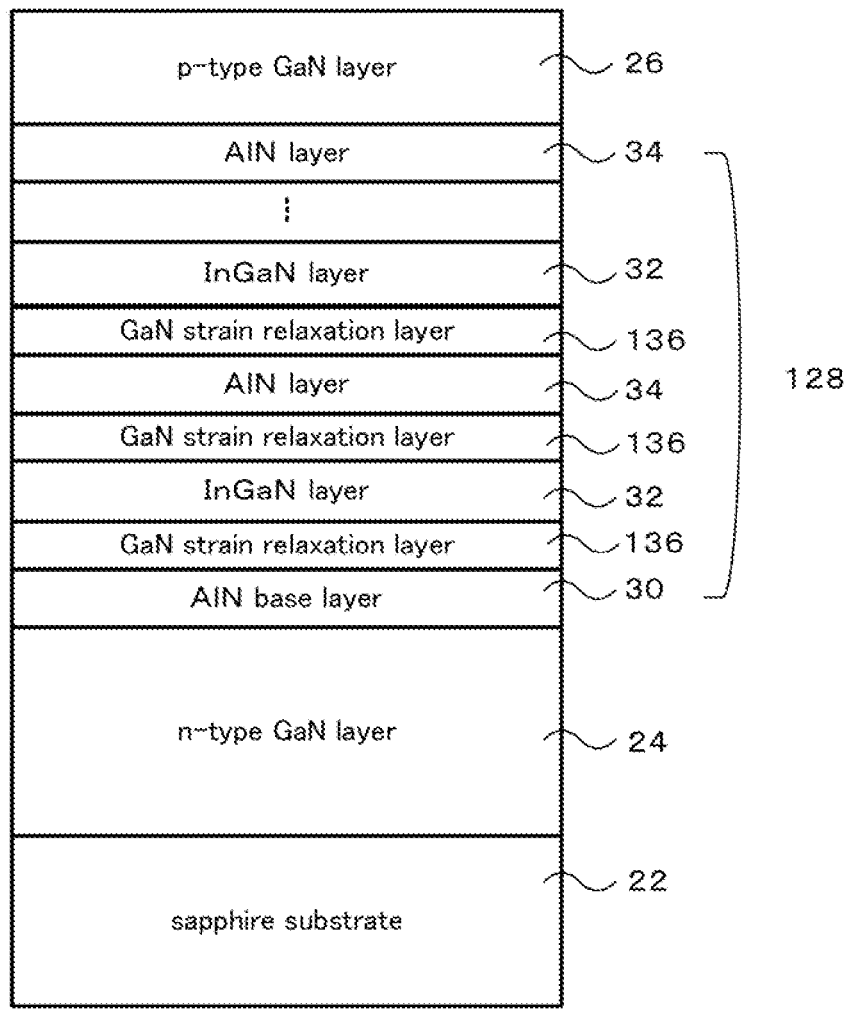
FIG. 8 is a diagram illustrating an example of configuration of a layered structure 128 in a light emitting diode element 120 of a second embodiment.

FIG. 8 is a diagram illustrating an example of configuration of the layered structure 128 in the light emitting diode element 120 of the second embodiment. The layered structure 128 includes GaN strain relaxation layers 136 of 0.5 nm in thickness formed between the InGaN layers 32 and the AlN layers 34.

Figure 9:
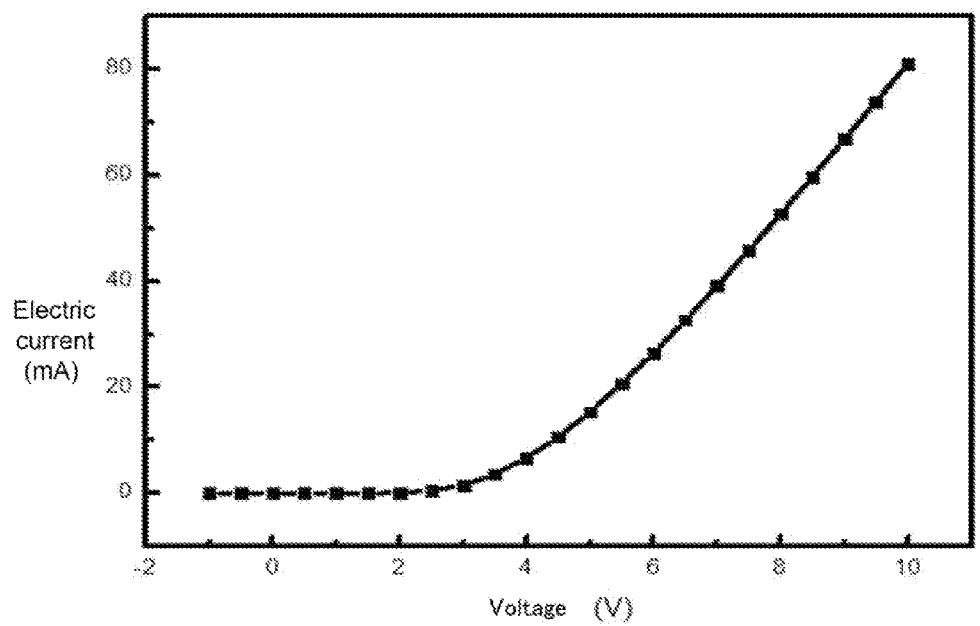
FIG. 9 is a diagram showing an example of relationship of electric current flowing between the n-type GaN layer 24 and the p-type GaN layer 26 to voltage applied between the n-type GaN layer 24 and the p-type GaN layer 26 in the light emitting diode element 120.
Figure 10:
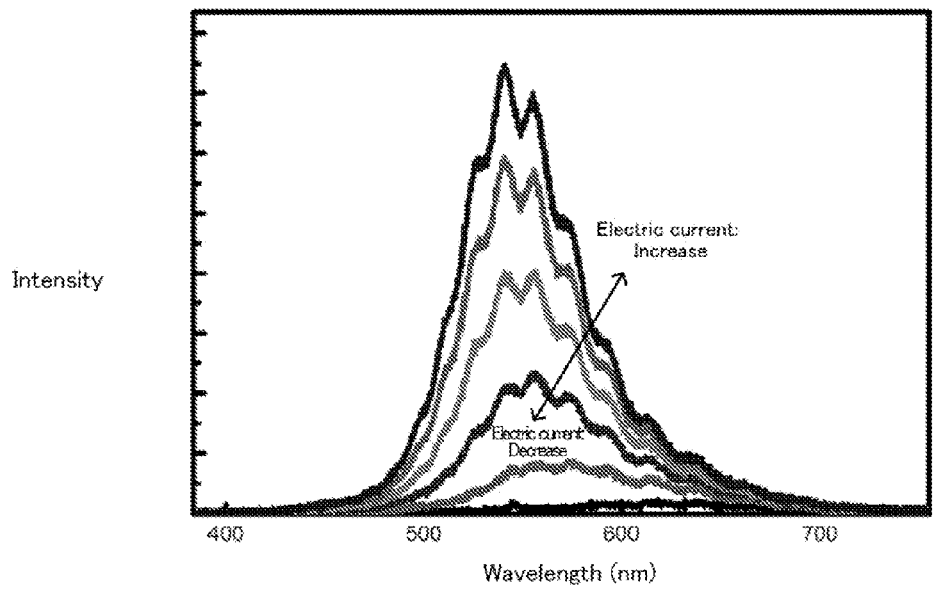
FIG. 10 is a diagram illustrating an example of relationship of intensity of light emitted from the light emitting diode element 120 to wavelength of the light with regard to a variation in electric current flowing between the n-type GaN layer 24 and the p-type GaN layer 26 in the light emitting diode element 120.

FIG. 9 is a diagram showing an example of relationship of electric current flowing between the n-type GaN layer 24 and the p-type GaN layer 26 to voltage applied between the n-type GaN layer 24 and the p-type GaN layer 26 in the light emitting diode element 120. FIG. 10 is a diagram illustrating an example of relationship of intensity of light emitted from the light emitting diode element 120 to wavelength of the light with regard to a variation in electric current flowing between the n-type GaN layer 24 and the p-type GaN layer 26 in the light emitting diode element 120. As shown in FIG. 10, the light emitting diode element 120 emits light in a relatively wide wavelength range of about 480 nm to 700 nm or, in other words, emits light of white color as a whole. Increasing the electric current flowing between the n-type GaN layer 24 and the p-type GaN layer 26 increases the intensity of the light and provides a peak at the wavelength of about 540 nm to emit light of greenish white color. Shifting the wavelength of the peak to the shorter wavelength than that of the light emitting diode element 20 of the first embodiment may be attributed to that the presence of the GaN strain relaxation layers 136 relieves the tensile stress applied to the AlN base layer 30 and the AlN layers 34 and divides the AlN base layer 30 and the AlN layers 34 into larger sizes. This provides the layered structures 128 in larger sizes than those of the layered structures 28.

Figure 11:
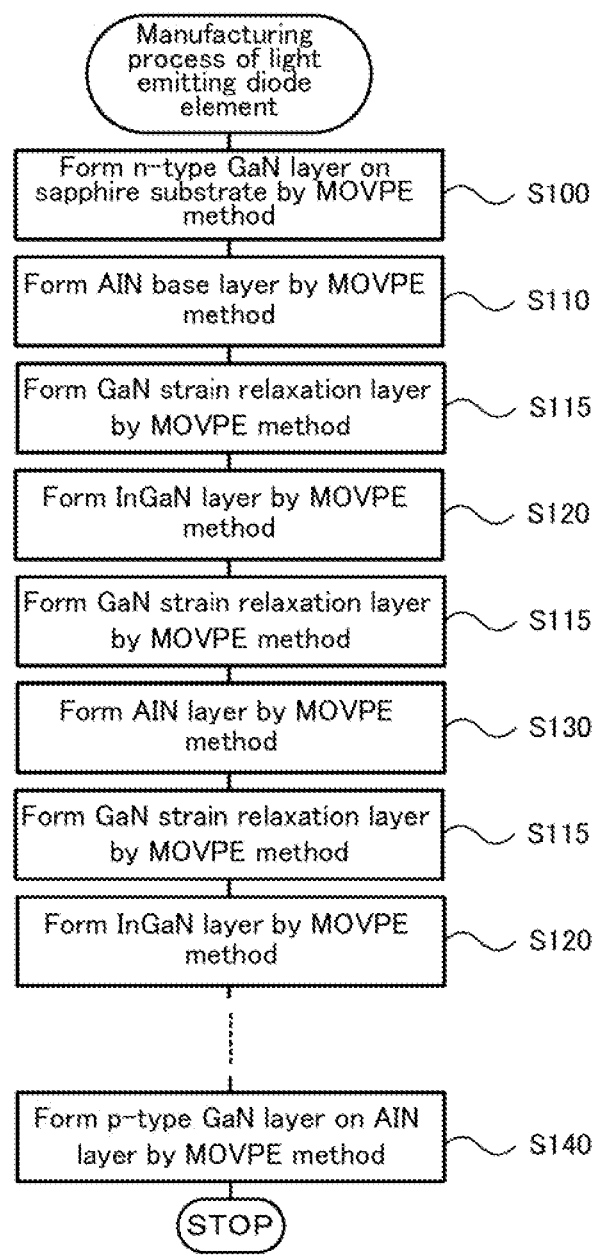
FIG. 11 is a flowchart showing an example of manufacturing process of the light emitting diode element 120.

The following describes a method of manufacturing the light emitting diode element 120. FIG. 11 is a flowchart showing an example of manufacturing process of the light emitting diode element 120. FIG. 12 is a table showing an example of partial pressures of TMG, TMA, TEG, TMI, Cp2Mg, $NH_3$ and $SiH_4$ in the MOVPE method employed for formation of the GaN strain relaxation layers 136. The manufacturing process shown in FIG. 11 is similar to the manufacturing process of FIG. 6, except that step S115 is included between step S110 and S120 and between step S120 and step S130 in the manufacturing process of the light emitting diode element 20 of FIG. 6. The like steps are expressed by the like step numbers and are not specifically described.

After sequentially forming an n-type GaN layer 24 and an AlN base layer 30 on a sapphire substrate 22 by the MOVPE method (steps S100 and S110), the manufacturing process subsequently forms a GaN strain relaxation layer 136 of 2 nm in thickness from GaN on the AlN base layer 30 at 780° C. and the pressure of the reaction vessel set to 100 hPa (step S115). This relieves the tensile stress applied to the AlN base layer 30 and is likely to divide the AlN base layer 30 into areas of larger sizes.

The manufacturing process sequentially forms an InGaN layer 32 (step S120), a GaN strain relaxation layer 136 of 2 nm in thickness from GaN on the InGaN layer 32 (step S115), an AlN layer 34 (step S130), a GaN strain relaxation layer 136 (step S115) and an InGaN layer 32 (step S120) at 780° C. and the pressure of the reaction vessel set to 100 hPa. The processes of steps S120, S115 and S130 are repeated a predetermined number of times (for example, four times). The manufacturing process then forms a p-type GaN layer 26 on the lastly formed AlN layer 34 (step S140) and is terminated. Forming the GaN strain relaxation layers 136 between the AlN base layer 30 and the InGaN layer 32 and between the InGaN layer and the AlN layer 34 allows for emission of light of reddish white color in a shorter wavelength.

In the light emitting diode element 120 of the second embodiment described above, the GaN strain relaxation layers 136 are formed between the AlN base layer 30 and the InGaN layer 32 and between the InGaN layers 32 and the AlN layers 34. This allows for emission of light of reddish white color in a longer wavelength.

In the light emitting diode element 120 of the second embodiment, the GaN strain relaxation layers 136 are formed between the AlN base layer 30 and the InGaN layer 32 and between the InGaN layers 32 and the AlN layers 34. The GaN strain relaxation layer 136 may, however, be formed only either between the AlN base layer 30 and the InGaN layer 32 or between the InGaN layers 32 and the AlN layers 34. At least one GaN strain relaxation layer 136 may be formed between the InGaN layer 32 and the AlN layer 34.

A light emitting diode element 220 of a third embodiment has similar configuration to that of the light emitting diode element 20 of the first embodiment, except that an AlN base layer 30 and AlN layers 34 have different thicknesses from those of the first embodiment, that GaN strain relaxation layers 236 are provided between an n-type GaN layer 24 and the AlN base layer 30 and between InGaN layers 32 and their upper AlN layers 34, and that an AlGaN layer 238 is provided between an exposed GaN strain relaxation layer 236 of each layered structure 228 and a p-type GaN layer. The like elements in the light emitting diode element 220 to those in the light emitting diode element 20 of the first embodiment are expressed by the like numerical symbols and are not specifically described.

Figure 13:
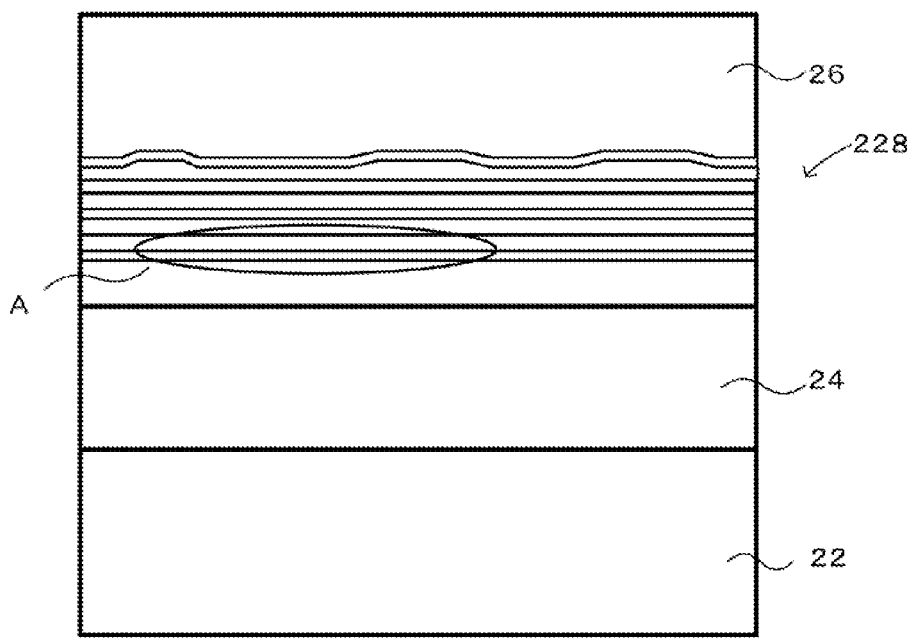
FIG. 13 is a sectional view schematically illustrating the section of a main part of a light emitting diode element 220 according to a third embodiment of the invention.
Figure 14:
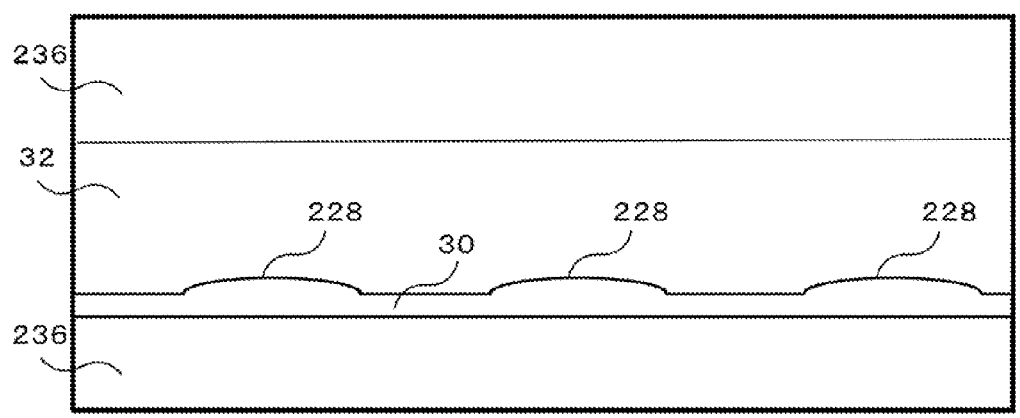
FIG. 14 is an enlarged view illustrating an area A of FIG. 13.
Figure 15:
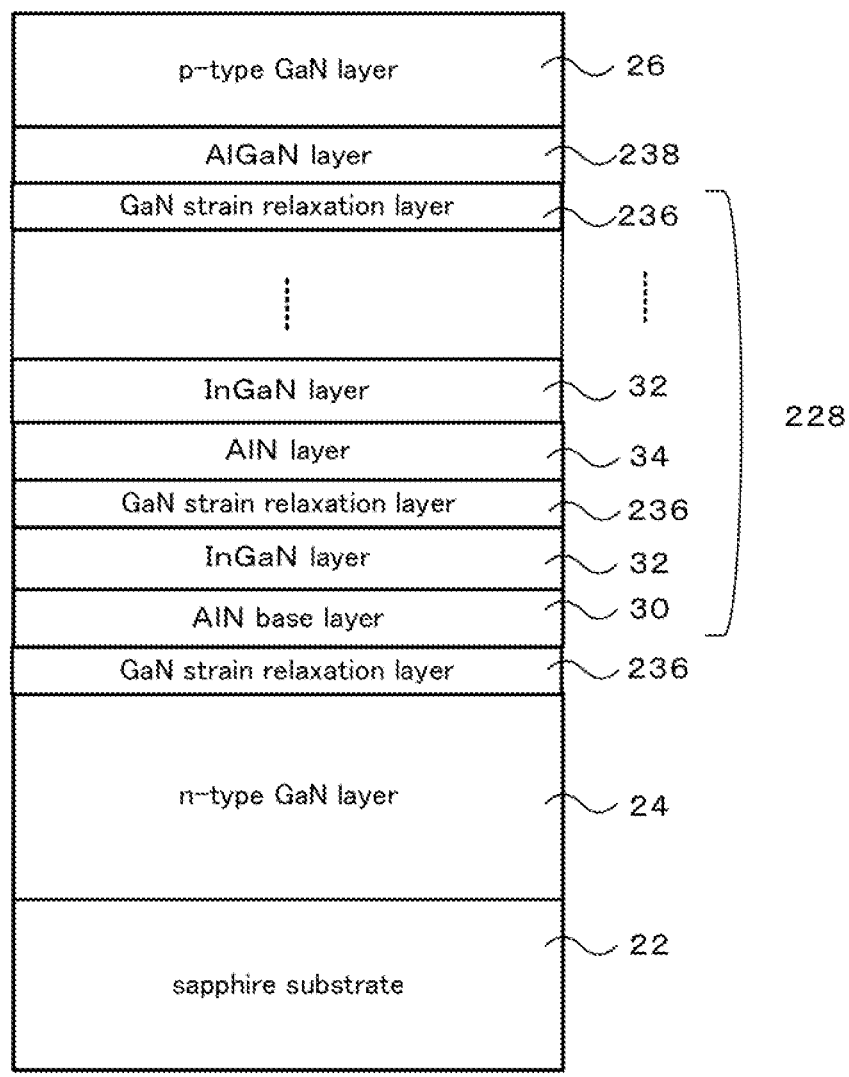
FIG. 15 is a diagram illustrating an example of configuration of a layered structure 228.

FIG. 13 is a sectional view schematically illustrating the section of a main part of the light emitting diode element 220 according to the third embodiment of the invention. FIG. 14 is an enlarged view illustrating an area A of FIG. 13. FIG. 15 is a diagram illustrating an example of configuration of the layered structure 228. The AlN base layer 30 and the AlN layers 34 of the light emitting diode element 220 are respectively formed to have thicknesses of about 0.6 nm. The light emitting diode element 220 includes a GaN strain relaxation layer 236 of 8.4 nm in thickness formed from GaN between the n-type GaN layer 24 and the AlN base layer 30, GaN strain relaxation layers 236 of 11 nm in thickness formed from GaN between the InGaN layers 32 and their upper AlN layers 34 of the layered structure 228, and an AlGaN layer 238 of 2.3 nm in thickness formed from AlGaN between an exposed GaN strain relaxation layer 236 of the layered structure 228 and the p-type GaN layer. The GaN strain relaxation layers 236 formed as described above serve to relieve the stress applied to the AlN base layer 30 and the AlN layers 34 and are likely to divide the AlN base layer 30 and the AlN layers 34 into areas of larger sizes, compared with the light emitting diode elements 20 and 120 of the first and the second embodiments. The respective side faces of the layered structures 228 are gentle sloped surfaces as shown in FIGS. 13 and 14. This may be attributed to division of the AlN base layer 30 and the AlN layers 34 into larger sizes.

Figure 16:
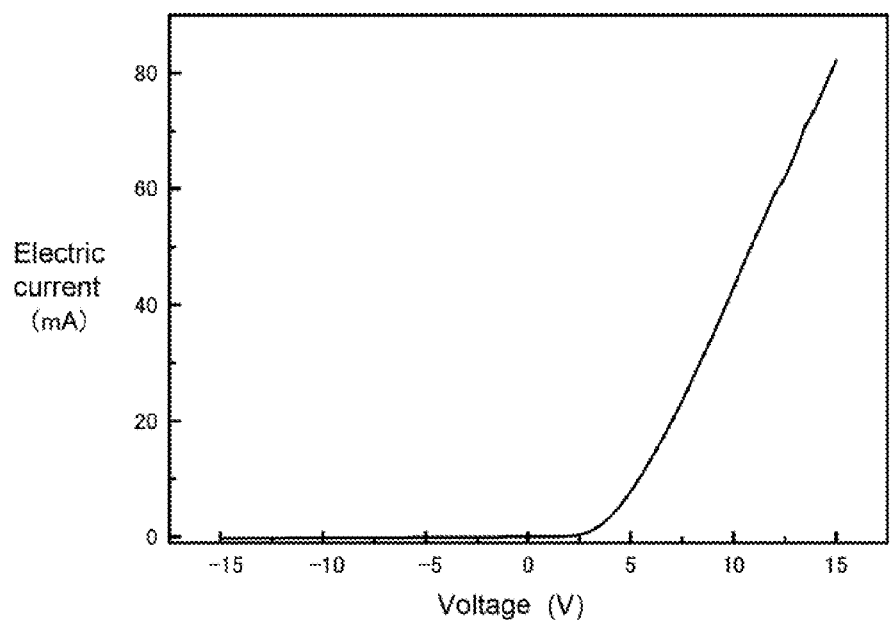
FIG. 16 is a diagram showing an example of relationship of electric current flowing between the n-type GaN layer 24 and the p-type GaN layer 26 to voltage applied between the n-type GaN layer 24 and the p-type GaN layer 26 in the light emitting diode element 220.

FIG. 16 is a diagram showing an example of relationship of electric current flowing between the n-type GaN layer 24 and the p-type GaN layer 26 to voltage applied between the n-type GaN layer 24 and the p-type GaN layer 26 in the light emitting diode element 220. FIG. 17 is a diagram illustrating an example of relationship of intensity of light emitted from the light emitting diode element 220 to wavelength of the light with regard to a variation in electric current flowing between the n-type GaN layer 24 and the p-type GaN layer 26 in the light emitting diode element 220. As illustrated, the light emitting diode element 220 emits light in a relatively wide wavelength range of about 450 nm to 550 nm or, in other words, emits light of white color as a whole. Increasing the electric current flowing between the n-type GaN layer 24 and the p-type GaN layer 26 increases the intensity of the light and provides peaks at the wavelengths of about 480 nm and about 600 nm to emit light of bluish white color and light of orange-tinged white color. This may be attributed to that the presence of the GaN strain relaxation layers 236 divides the AlN base layer 30 and the AlN layers 34 into larger sizes and thereby forms the layered structures 228 in larger sizes, compared with the light emitting diode elements 20 and 120. Formation of the GaN strain relaxation layers 236 between the n-type GaN layer 24 and the AlN base layer 30 and between the InGaN layers 32 and their upper AlN layers 34 of the layered structures 228 allows for emission of light of the shorter wavelength, compared with the light emitting diode element 20 of the first embodiment.

FIG. 18 is a flowchart showing an example of manufacturing process of the light emitting diode element 220. FIG. 19 is a table showing an example of partial pressures of TMG, TMA, TEG, TMI, Cp2Mg, $NH_3$ and $SiH_4$ in the MOVPE method employed for formation of the respective layers. The like steps in the manufacturing process of FIG. 18 to those in the manufacturing process of the light emitting diode element 20 of FIG. 6 are expressed by the like step numbers and are not specifically described.

The manufacturing process first forms an n-type GaN layer 24 on a sapphire substrate 22 (step S100) and subsequently forms a GaN strain relaxation layer 236 of 8.4 nm in thickness from GaN at 780° C. and the pressure of the reaction vessel set to 100 hPa (step S205). The manufacturing process sequentially forms an AlN base layer 30 of 0.6 nm in thickness and an InGaN layer 32 of 8 nm in thickness by the MOVPE method (steps S110 and S120) and subsequently forms a GaN strain relaxation layer 236 of 11 nm in thickness from GaN on the InGaN layer 32 at 780° C. and the pressure of the reaction vessel set to 100 hPa (step S225).

The manufacturing process sequentially forms an AlN layer 34 and an InGaN layer 32 on the InGaN layer (step S130) and subsequently forms a GaN strain relaxation layer 236 (step S225). The processes of steps S120, S130 and S225 are repeated a predetermined number of times (four example, four times). The manufacturing process forms an AlGaN layer 238 of 8.4 nm in thickness from AlGaN on the lastly formed GaN strain relaxation layer 236 at 1020° C. and the pressure of the reaction vessel set to 200 hPa (step S235), subsequently forms a p-type GaN layer 26 on the AlGaN layer 238 (step S140), and is terminated. Forming the GaN strain relaxation layers 236 between the n-type GaN layer 24 and the AlN base layer 30 and between the InGaN layers 32 and their upper AlN layers 34 manufactures the light emitting diode element 220 that emits light of the shorter wavelength. Manufacturing the light emitting diode element 220 of such characteristic may be attributed to that formation of the GaN strain relaxation layers 23 relieves the tensile stress applied to the AlN base layer 30 and the AlN layers 34 and thereby allows for division of the AlN base layer 30 and the AlN layers 34 into larger sizes.

The light emitting diode element 220 of the third embodiment described above includes the GaN strain relaxation layers 236 formed between the n-type GaN layer 24 and the AlN base layer 30 and between the InGaN layers 32 and their upper AlN layers 34 and thereby allows for emission of light of the shorter wavelength.

In the light emitting diode elements 20, 120 and 220 of the first to the third embodiments, the InGaN layer 32 and AlN layer 34 are stacked multiple times in the layered structures 28, 128 or 228. Alternatively the InGaN layer 32 and the AlN layer 34 may be stacked only once.

A light emitting diode element 420 of a fourth embodiment has similar configuration to that of the light emitting diode element 20 of the first embodiment, except that a quantum well structure 440 is provided between layered structures 28 and an n-type GaN layer 24, that an AlGaN block layer 450 is provided between the layered structures 28 and a p-type GaN layer 26 and that a single InGaN layer 32 and a single AlN layer 34 are stacked on an AlN base layer 30 in each of the layered structures 28. The like elements in the light emitting diode element 420 to those in the light emitting diode element 20 of the first embodiment are expressed by the like numerical symbols and are not specifically described.

FIG. 20 is a sectional view schematically illustrating the section of a main part of the light emitting diode element 420 according to the fourth embodiment of the invention. As illustrated, the light emitting diode element 420 is formed on a sapphire substrate 22 and includes a nucleation layer (not shown) of 25 nm in thickness formed from GaN, a GaN non-doped layer (not shown) of 300 nm in thickness formed from GaN without doping any impurity, an n-type GaN layer 24 of 3.4 μm in thickness formed from n-type GaN, a quantum well structure 440 formed on the n-type GaN layer 24, a plurality of island-shaped layered structures 28 of 40 nm in thickness formed in random sizes with sloped side faces on the quantum well structure 440, an AlGaN block layer 450 formed from AlGaN on the layered structures 28, and a p-type GaN layer 26 formed on the AlGaN block layer 450.

The quantum well structure 440 is provided as a general quantum well structure including three GaN barrier layers 442 of 13 nm in thickness formed from GaN and two InGaN well layers 444 of 2 nm in thickness formed from InGaN having smaller band gap than GaN between the respective two of the three GaN barrier layers 442.

Each layered structure 28 is configured such that an InGaN layer 32 made of InGaN and an AlN layer 34 made of AlN are stacked on an AlN base layer 30 made of AlN.

The following describes the operations of the light emitting diode element 420 having the above configuration. FIG. 21 is a diagram illustrating an example of relationship of intensity of light emitted from the light emitting diode element 420 to wavelength of the light. FIG. 22 is a diagram illustrating an example of relationship of intensity of light emitted from the light emitting diode element 420 to wavelength of the light with regard to a variation in electric current flowing between the n-type GaN layer 24 and the p-type GaN layer 26. As illustrated, the light emitting diode element 420 emits light in a relatively wide wavelength range of about 450 nm to 600 nm or, in other words, emits light of white color as a whole. Increasing the electric current flowing between the n-type GaN layer 24 and the p-type GaN layer 26 increases the intensity of the light and reaches a maximum at the wavelength of 550 nm or around 550 nm to emit light of white color. The light emitting diode element 420 emits light of the higher intensity: the intensity of light is about ten times the intensity of light of the light emitting diode element 20 shown in FIG. 5. Emitting the light of white color having the higher intensity than that of the light emitting diode element 20 may be attributed to the quantum well structure 440 provided between the layered structures 28 and the n-type GaN layer 24. This configuration enables the light emitting diode element 420 to emit light of the higher intensity.

FIG. 23 is a flowchart showing an example of manufacturing process of the light emitting diode element 420. FIG. 24 is a table showing an example of partial pressures of TMG, TMA, TEG, TMI, Cp2Mg, $NH_3$ and $SiH_4$ in the MOVPE method employed for formation of the respective layers. The like steps in the manufacturing process of FIG. 23 to those in the manufacturing process of the light emitting diode element 20 of FIG. 6 are expressed by the like step numbers and are not specifically described.

The manufacturing process first forms an n-type GaN layer 24 (step S100) and subsequently forms a GaN barrier layer 442 from GaN at 780° C. and the pressure of the reaction vessel set to 200 hPa by the MOVPE method (step S101). The manufacturing process then forms an InGaN well layer 444 of 2 nm in thickness from InGaN at 780° C. and the pressure of the reaction vessel set to 200 hPa by the MOVPE method (step S102). The processes of steps S101 and S102 are repeated once again. This series of processes forms the quantum well structure 440.

After forming the quantum well structure 440, the manufacturing process sequentially forms an AlN base layer 30 of 0.6 nm in thickness, an InGaN layer 32 of 4 nm in thickness and an AlN layer 34 of 4 nm in thickness by the MOVPE method to form layered structures 28 (steps S110 to S130). The manufacturing process subsequently forms an AlGaN block layer 450 of 8.4 nm in thickness from AlGaN at 1020° C. and the pressure of the reaction vessel set to 100 hPa (step S135), forms a p-type GaN layer 26 on the AlGaN block layer 450 (step S140), and is terminated. Forming the quantum well structure 440 between the n-type GaN layer 24 and the AlN base layer 30 manufactures the light emitting diode element 420 that emits light of the higher intensity.

The light emitting diode element 520 of the fourth embodiment described above includes the quantum well structure 440 between the n-type GaN layer 24 and the AlN base layer 30. This manufactures the light emitting diode element 420 that emits light of the higher intensity.

In the light emitting diode element 420 of the fourth embodiment, the layered structure 28 is configured such that the InGaN layer 32 and the AlN layer 34 are alternately stacked only once on the AlN base layer 30. The layered structure 28 may, however, be configured such that the InGaN layer 32 and the AlN layer 34 are alternately stacked twice (two layers each). In the latter configuration, in terms of emission of light of the higher intensity, the quantum well structure 440 is especially preferably configured to include three GaN barrier layers 442 and two InGaN well layers 444 formed between the respective two GaN barrier layers of the three GaN barrier layers or configured to include two GaN barrier layers 442 and one InGaN well layers 444 formed between the two GaN barrier layers.

In the light emitting diode element 420 of the fourth embodiment, the quantum well structure 440 is configured to include three GaN barrier layers 442 and two InGaN well layers 444 formed between the respective two GaN barrier layers of the three GaN barrier layers. The quantum well structure 440 should be necessarily configured to include n GaN barrier layers 442 (where n is an integral number of not less than 2) and (n−1) InGaN well layers 444 formed between the respective two GaN barrier layers of the n GaN barrier layers. For example, as illustrated in FIG. 25 as a light emitting diode element 520 of a modification, the quantum well structure 440 may be configured by stacking six GaN barrier layers 442 and five InGaN well layers 444. FIG. 26 is a diagram illustrating an example of relationship of intensity of light emitted from the light emitting diode element 520 of the modification to wavelength of the light. FIG. 27 is a diagram illustrating an example of relationship of intensity of light emitted from the light emitting diode element 520 of the modification to wavelength of the light with regard to electric current flowing between the n-type GaN layer 24 and the p-type GaN layer 26 in the light emitting diode element 520. As illustrated, the light emitting diode element 520 emits light of the higher intensity.

In the light emitting diode element 420 of the fourth embodiment, the InGaN layer 32 and the AlN layer 34 are stacked only once in the layered structures 28, 128 or 228. The InGaN layer 32 and the AlN layer 34 may, however, be stacked multiple number of times.

In the light emitting diode element 420 of the fourth embodiment, the layered structure 28 does not include the GaN strain relaxation layers that are included in the light emitting diode element 120 of the second embodiment. As illustrated in FIG. 28, a light emitting diode element 620 of a modification may be configured to include GaN strain relaxation layers 636.

In the light emitting diode element 420 of the fourth embodiment, the quantum well structure 440 is provided between the n-type GaN layer 24 and the AlN base layer 30. As illustrated in FIG. 29 as a light emitting diode element 720 of a modification, a quantum well structure 440 may be provided between layered structures 28 and a p-type GaN layer 26. In the latter configuration, it is preferable to sequentially form an AlGaN block layer 450 on layered structures 28, form an AlN layer 750 on the AlGaN block layer 450, form a quantum well structure 440 on the AlN layer 750, form an AlGaN layer 752 made of AlGaN on the quantum well structure 440 and form a p-type GaN layer 26 on the AlGaN layer 752.

In the light emitting diode elements 20, 120, 220, 420, 520, 620 and 720 of the first to the fourth embodiments and the modifications, increase in sizes of the layered structures 28, 128 or 228 is expected to cause emission of light at the shorter wavelength. The wavelength of emitted light may be changed by controlling the sizes of the layered structures 28, 128 or 228. The sizes of the layered structures 28, 128 or 228 may be controlled by adjusting the thickness of the AlN base layer 30, adequately regulating the locations and the thickness of the GaN strain relaxation layers 136 or 236, and adjusting the crystal growth rates of the respective layers (supply partial pressures of raw materials). For example, in a configuration without the GaN strain relaxation layers 136 or 236, increase in thickness of the AlN base layer 30 is likely to accelerate accumulation of the tensile strain relative to the n-type GaN layer 24 in the AlN base layer 30 and thereby divide the AlN base layer 30 into areas of smaller sizes. Accordingly, increasing the thickness of the AlN base layer 30 is likely to provide the layered structures 28 of the smaller sizes.

The thicknesses of the respective layers shown in the light emitting diode elements 20, 120, 220, 420, 520, 620 and 720 of the first to the fourth embodiments and the modifications are not limited to those described above but may be adequately changed according to the performances of the light emitting diode element desired for the application or the like.

The temperature, the pressure, the partial pressures of the reactive gases and the like in the MOVPE method for manufacturing the light emitting diode elements 20, 120, 220, 420, 520, 620 and 720 of the first to the fourth embodiments and the modifications may be adequately changed according to the performances of the light emitting diode element desired for the application or the like.

In the light emitting diode elements 20, 120, 220, 420, 520, 620 and 720 of the first to the fourth embodiments and the modifications, the AlN base layer 30 and the layered structures 28 are formed at 780° C. by the MOVPE method. The AlN base layer 30 and the layered structures 28 should be necessarily formed at 750° C. or higher temperature by the MOVPE method and is especially preferably formed between 750° C. and 800° C. inclusive by the MOVPE method.

In the light emitting diode elements 20, 120, 220, 420, 520, 620 and 720 of the first to the fourth embodiments and the modifications, the layered structure 28, 128 or 228 includes the AlN base layer 30 made of AlN and the AlN layers 34 made of AlN. The AlN base layer 30 and the AlN layers 34 should be necessarily formed as nitride layers formed from a nitride that contains at least one of aluminum, gallium and indium and receives a tensile strain by gallium nitride. For example, the AlN base layer 30 may be replaced by an AlGaN base layer made of AlGaN or a layer including a trace amount of indium in addition to AlGaN or AlN. The AlN layers 34 may be replaced by AlGaN layers made of AlGaN or layers including a trace amount of indium in addition to AlGaN or AlN.

In the light emitting diode elements 20, 120, 220, 420, 520, 620 and 720 of the first to the fourth embodiments and the modifications, the n-type GaN layer 24 is formed on the sapphire substrate 22, and the p-type GaN layer 26 is formed on the layered structures 28. A p-type GaN layer made of p-type GaN may be formed in place of the n-type GaN layer 24, and an n-type GaN layer made of n-type GaN may be formed in place of the p-type GaN layer 26.

In the light emitting diode elements 20, 120, 220, 420, 520, 620 and 720 of the first to the fourth embodiments and the modifications, the substrate used is made of sapphire. A substrate made of silicon or n-type GaN may be used. The substrate may be removed after manufacture of the light emitting diode element 20, 120, 220, 420, 520, 620 or 720.

The following describes the correspondence relationship between the primary components of the embodiment and the primary components of the invention described in Summary of Invention. The n-type GaN layer 24 of the embodiment corresponds to the "first conductive-type semiconductor layer"; the p-type GaN layer 26 corresponds to the "second conductive-type semiconductor layer"; the AlN base layer 30 corresponds to the "base layer"; the InGaN layers 32 correspond to the "first layer"; the AlN layer 34 corresponds to the "second layer"; and the layered structure 28 corresponds to the "layered structure". Step S110 of FIG. 6 that forms AlN base layer 30 on the n-type GaN layer 24 by the MOVPE method corresponds to the "base layer forming step"; step S120 that forms InGaN layers 32 on the AlN base layer 30 by the MOVPE method and step S130 that forms AlN layers 34 on the InGaN layers 32 by the MOVPE method correspond to the "layered structure forming step"; and step S140 that forms p-type GaN layer 26 on the AlN layers 34 by the MOVPE method corresponds to the "second conductive-type semiconductor layer forming step".

The correspondence relationship between the primary components of the embodiment and the primary components of the invention, regarding which the problem is described in Summary of Invention, should not be considered to limit the components of the invention, regarding which the problem is described in Summary of Invention, since the embodiment is only illustrative to specifically describes the aspects of the invention, regarding which the problem is described in Summary of Invention. In other words, the invention, regarding which the problem is described in Summary of Invention, should be interpreted on the basis of the description in the Summary of Invention, and the embodiment is only a specific example of the invention, regarding which the problem is described in Summary of Invention.

The aspect of the invention is described above with reference to the embodiment. The invention is, however, not limited to the above embodiment but various modifications and variations may be made to the embodiment without departing from the scope of the invention.

INDUSTRIAL APPLICABILITY

The technique of the invention is preferably applicable to the manufacturing industries of light emitting diode elements.

The invention claimed is:

1. A light emitting diode element that comprises a first conductive-type semiconductor layer that is made of first conductive-type gallium nitride and a second conductive-type semiconductor layer that is made of second conductive-type gallium nitride different from the first conductive-type gallium nitride,
the light emitting diode element further comprising
a plurality of island-shaped layered structures that are formed in random sizes between the first conductive-type semiconductor layer and the second conductive-type semiconductor layer, wherein the plurality of island-shaped layered structures is configured by stacking a first layer that is made of indium gallium nitride and a second layer that is made of a nitride containing at least one of aluminum, gallium and indium and receiving tensile strain by gallium nitride, on a base layer that is made of a nitride containing at least one of aluminum, gallium and indium and receiving tensile strain by gallium nitride.

2. The light emitting diode element according to claim 1, wherein the plurality of island-shaped layered structures is configured by alternatively stacking the first layer and the second layer multiple times.

3. The light emitting diode element according to claim 1, wherein the second layer is formed thinner than the first layer.

4. The light emitting diode element according to claim 1, further comprising
a strain relaxation layer that is formed from gallium nitride in at least one location out of between the first conductive-type semiconductor layer and the base layer, between the base layer and the first layer, and between the first layer and the second layer.

5. The light emitting diode element according to claim 4, wherein the layered structure includes the strain relaxation layer exposed,
the light emitting diode element further comprising
a second strain relaxation layer that is formed from aluminum gallium nitride between the layered structures and the second conductive-type semiconductor layer.

6. The light emitting diode element according to claim 4, wherein the strain relaxation layer is formed thinner than the first layer.

7. The light emitting diode element according to claim 1, further comprising
a quantum well structure that is formed either between the plurality of island-shaped layered structures and the first conductive-type semiconductor layer or between the plurality of island-shaped layered structures and the second conductive-type semiconductor layer, the quantum well structure being configured to include n barrier layers and (n−1) quantum well layers that are formed from a material having a smaller band gap than that of the barrier layer between respective two barrier layers of the n barrier layers, where n is an integral number of not less than 2.

8. The light emitting diode element according to claim 7, wherein the plurality of island-shaped layered structures is configured by alternately stacking the first layer and the second layer once or twice, and
n is either 2 or 3.

9. A method of manufacturing a light emitting diode element that comprises a first conductive-type semiconductor layer that is made of first conductive-type gallium nitride and a second conductive-type semiconductor layer that is made of second conductive-type gallium nitride,
the method of manufacturing the light emitting diode element comprising:
a base layer forming step that forms a base layer that contains at least one of aluminum, gallium and indium and has a different crystal size than gallium nitride, on the first conductive-type semiconductor layer by metal organic vapor phase epitaxy;
a layered structure forming step that performs a step of forming a first layer from indium gallium nitride on the formed base layer by metal organic vapor phase epitaxy and a step of forming a second layer that contains at least one of aluminum, gallium and indium and has a different crystal size than gallium nitride, by metal organic vapor phase epitaxy, so as to form a plurality of island-shaped layered structures in random sizes configured by stacking the first layer and the second layer; and
a second conductive-type semiconductor layer forming step that forms the second conductive-type semiconductor layer from the second conductive-type gallium nitride on the formed plurality of island-shaped layered structures by metal organic vapor phase epitaxy.

10. The method of manufacturing the light emitting diode element according to claim 9,
wherein the layered structure forming step alternately repeats the step of forming the first layer and the step of forming the second layer multiple number of times, so as to form the plurality of island-shaped layered structures configured by alternately stacking multiple first layers and multiple second layers.

11. The method of manufacturing the light emitting diode element according to claim 9,
wherein the layered structure forming step comprises a step of forming a strain relaxation layer from gallium nitride by metal organic vapor phase epitaxy in at least one location out of between the first conductive-type semiconductor layer and the base layer, between the base layer and the first layer, and between the first layer and the second layer.

12. The method of manufacturing the light emitting diode element according to claim 11,
wherein the layered structure forming step comprises a step of forming a second strain relaxation layer from aluminum gallium nitride on the strain relaxation layer by metal organic vapor phase epitaxy, and the second conductive-type semiconductor layer forming step forms the second conductive-type semiconductor layer on the second strain relaxation layer by metal organic vapor phase epitaxy.

\* \* \* \* \*